(12) United States Patent
Ozeki et al.

(10) Patent No.: US 12,153,319 B2
(45) Date of Patent: Nov. 26, 2024

(54) DISPLAY DEVICE

(71) Applicant: Japan Display Inc., Tokyo (JP)

(72) Inventors: Yoshitaka Ozeki, Tokyo (JP);
Nobutaka Ozaki, Tokyo (JP); Koshiro Moriguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/490,083

(22) Filed: Oct. 19, 2023

(65) Prior Publication Data

US 2024/0045295 A1 Feb. 8, 2024

Related U.S. Application Data

(63) Continuation of application No. 18/068,310, filed on Dec. 19, 2022, now Pat. No. 11,829,042, which is a continuation of application No. 17/704,211, filed on Mar. 25, 2022, now Pat. No. 11,561,445.

(30) Foreign Application Priority Data

Mar. 29, 2021 (JP) .................................. 2021-056081

(51) Int. Cl.
*G02F 1/1368* (2006.01)
*G02F 1/136* (2006.01)
*G02F 1/1362* (2006.01)
*H01L 27/12* (2006.01)

(52) U.S. Cl.
CPC ........ *G02F 1/1368* (2013.01); *G02F 1/13606* (2021.01); *G02F 1/136286* (2013.01); *H01L 27/1225* (2013.01); *H01L 27/124* (2013.01)

(58) Field of Classification Search
CPC ............... G02F 1/1368; G02F 1/13606; G02F 1/136286; H01L 27/124
See application file for complete search history.

(56) References Cited

U.S. PATENT DOCUMENTS

| | | | |
|---|---|---|---|
| 2011/0181825 A1* | 7/2011 | Ma ...................... | G02F 1/13394 349/155 |
| 2013/0256678 A1* | 10/2013 | Nishikawa ............ | H01L 29/786 257/72 |
| 2015/0200207 A1* | 7/2015 | Nozu .................... | H01L 27/124 438/585 |
| 2016/0116797 A1* | 4/2016 | Itou ................... | G02F 1/136227 349/41 |
| 2017/0212397 A1* | 7/2017 | Cao ................... | G02F 1/136213 |

* cited by examiner

*Primary Examiner* — James A Dudek
(74) *Attorney, Agent, or Firm* — K&L Gates LLP

(57) ABSTRACT

A display device includes a first transistor provided with an oxide semiconductor layer, a first gate wiring facing the oxide semiconductor layer and a first gate insulating layer between the oxide semiconductor layer and the first gate wiring, a first transparent conductive layer provided on at least a first insulating layer on the first transistor, the first transparent conductive layer having an area overlapping the gate wiring and being in contact with the oxide semiconductor layer in a first contact area not overlapping the gate wiring, a second transparent conductive layer provided above at least a second insulating layer on the first transparent conductive layer and being in contact with the first transparent conductive layer at a second contact area overlapping the gate wiring, and a third transparent conductive layer provided between the second transparent conductive layer and the second insulating layer.

19 Claims, 26 Drawing Sheets

DISPLAY DEVICE

CROSS REFERENCE TO RELATED APPLICATIONS

This application is a continuation of U.S. patent application Ser. No. 18/068,310, filed Dec. 19, 2022, which application is a continuation of U.S. patent application Ser. No. 17/704,211, filed on Mar. 25, 2022 and issued as U.S. Pat. No. 11,561,445 on Jan. 24, 2023, which application is based upon and claims the benefit of priority from the prior Japanese Patent Application No. 2021-056081 filed on Mar. 29, 2021, the entire contents of which are incorporated herein by reference.

FIELD

One embodiment of the present invention relates to a display device. In particular, one embodiment of the present invention relates to a display device using a transistor having an oxide semiconductor.

BACKGROUND

Recently, a transistor using an oxide semiconductor as a channel has been developed in place of amorphous silicon, a low-temperature polysilicon, and a single-crystal silicon (e.g., Japanese laid-open patent publication No. 2014-146819 and Japanese laid-open patent publication No. 2015-159315). The transistor using an oxide semiconductor as the channel is formed in a simple-structured, low-temperature process similar to a transistor using amorphous silicon as a channel. It is known that the transistor using an oxide semiconductor as a channel has higher mobility than the transistor using amorphous silicon as a channel and has a very low off-current.

Recently, a pixel size of a display device has been reduced. With the reduction of the pixel size, the reduction of a wiring width and transistor size is being studied. However, there is a limitation to these reductions, and an opening ratio is reduced due to arrangements of a metal layer and a semiconductor layer constituting a pixel circuit. Therefore, a transistor using an oxide semiconductor layer as a channel is being developed in which sufficient characteristics for driving a pixel circuit can be obtained even if the transistor size is small is used for a transistor of a pixel circuit.

SUMMARY

A display device according to an embodiment of the present disclosure includes, a first transistor provided with an oxide semiconductor layer, a first gate wiring facing the oxide semiconductor layer and a first gate insulating layer between the oxide semiconductor layer and the first gate wiring, a first transparent conductive layer provided on at least a first insulating layer on the first transistor, the first transparent conductive layer having an area overlapping the gate wiring and being in contact with the oxide semiconductor layer in a first contact area not overlapping the gate wiring, a second transparent conductive layer provided above at least a second insulating layer on the first transparent conductive layer and being in contact with the first transparent conductive layer at a second contact layer overlapping the gate wiring, a third transparent conductive layer provided between the second transparent conductive layer and the second insulating layer, a fourth transparent conductive layer provided above the second transparent conductive layer, a third insulating layer provided between the second transparent conductive layer and the third transparent conductive layer; and a fourth insulating layer provided between the second transparent conductive layer and the fourth transparent conductive layer, wherein the third insulating layer includes an opening pattern overlapping the second contact area.

A display device according to an embodiment of the present disclosure includes, a first transistor provided with an oxide semiconductor layer, a first gate wiring facing the oxide semiconductor layer and a first gate insulating layer between the oxide semiconductor layer and the first gate wiring, a first transparent conductive layer provided above a first insulating layer above the first transistor and in contact with the oxide semiconductor in a first contact area, a second transparent conductive layer provided over a second insulating layer over the first transparent conductive layer and electrically connected to the first transparent conductive layer in a second contact area overlapping the gate wiring, and an island-shaped electrode in contact with the first transparent conductive layer in the second contact area and in contact with the second transparent conductive layer.

DESCRIPTION OF EMBODIMENTS

Figure 1:
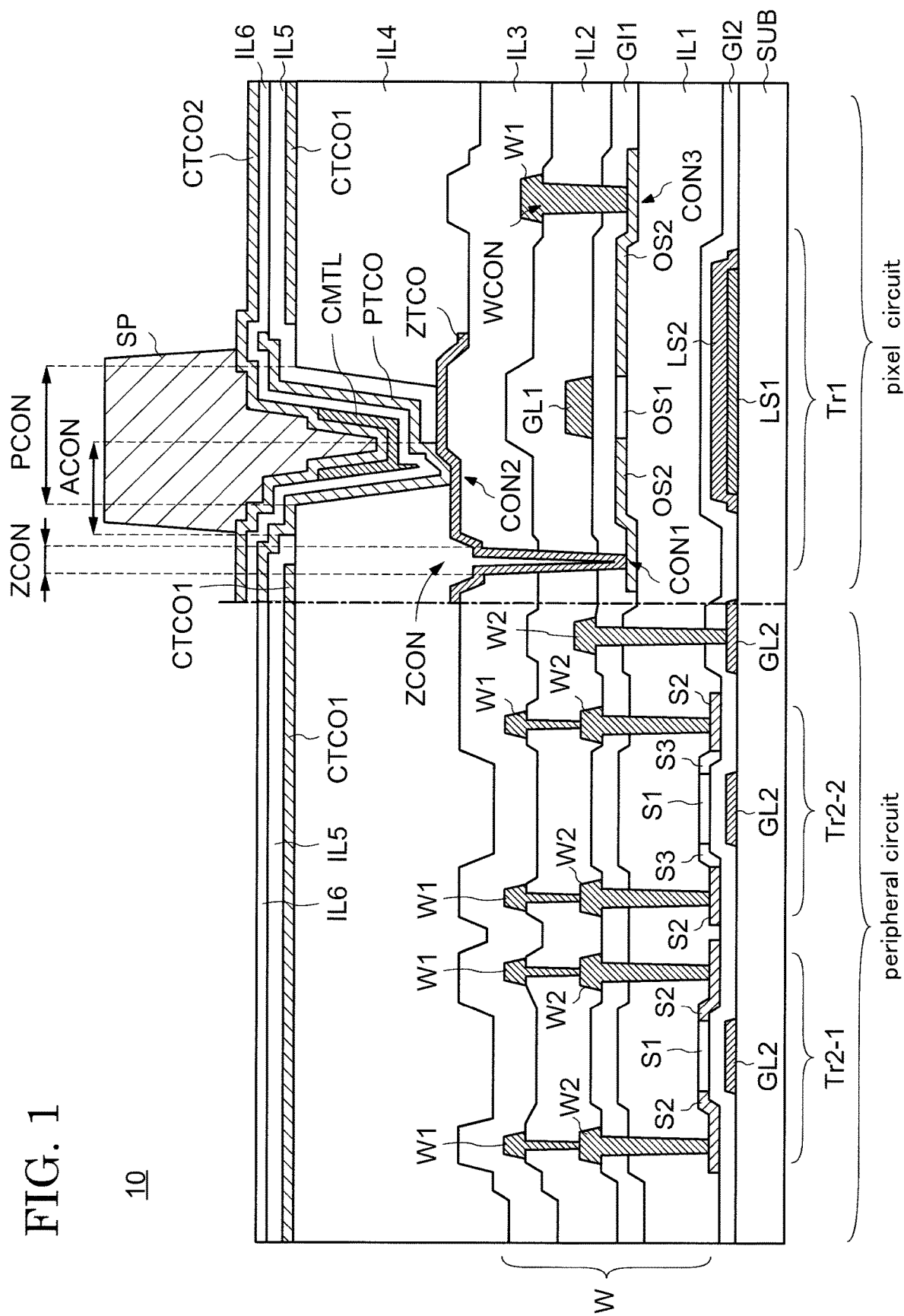
FIG. 1 is a cross-sectional view showing an outline a display device according to an embodiment of the present invention.

As a display device pixel is scaled down, a pixel electrode is more susceptible to capacitive coupling due to a signal line. If an attempt is made to drive a scaled down pixel at a high speed, the effect of crosstalk in which the potential of the pixel electrode changes due to the potential of the signal line may become apparent.

One object of an embodiment of the present invention is to reduce crosstalk in the miniaturized pixel in a display device.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective parts in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as upper or above. On the contrary, a direction from the oxide semiconductor layer to the substrate is referred to as lower or below. As described above, for convenience of explanation, although the phrase "above" or "below" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, and when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later will be described by exemplifying a liquid crystal display device including a liquid crystal layer as the display device, the structure in the present embodiment can be applied to a display device including the other electro-optical layers described above. The expressions "a includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where a includes other elements.

The following embodiments may be combined with each other as long as there is no technical contradiction.

1. First Embodiment

[1-1. Configuration of Display Device 10]

A configuration of a display device 10 according to an embodiment of the present invention will be described with reference to FIG. 1 to FIG. 16. FIG. 1 is a cross-sectional view showing an outline of a display device according to an embodiment of the present invention.

Figure 3:
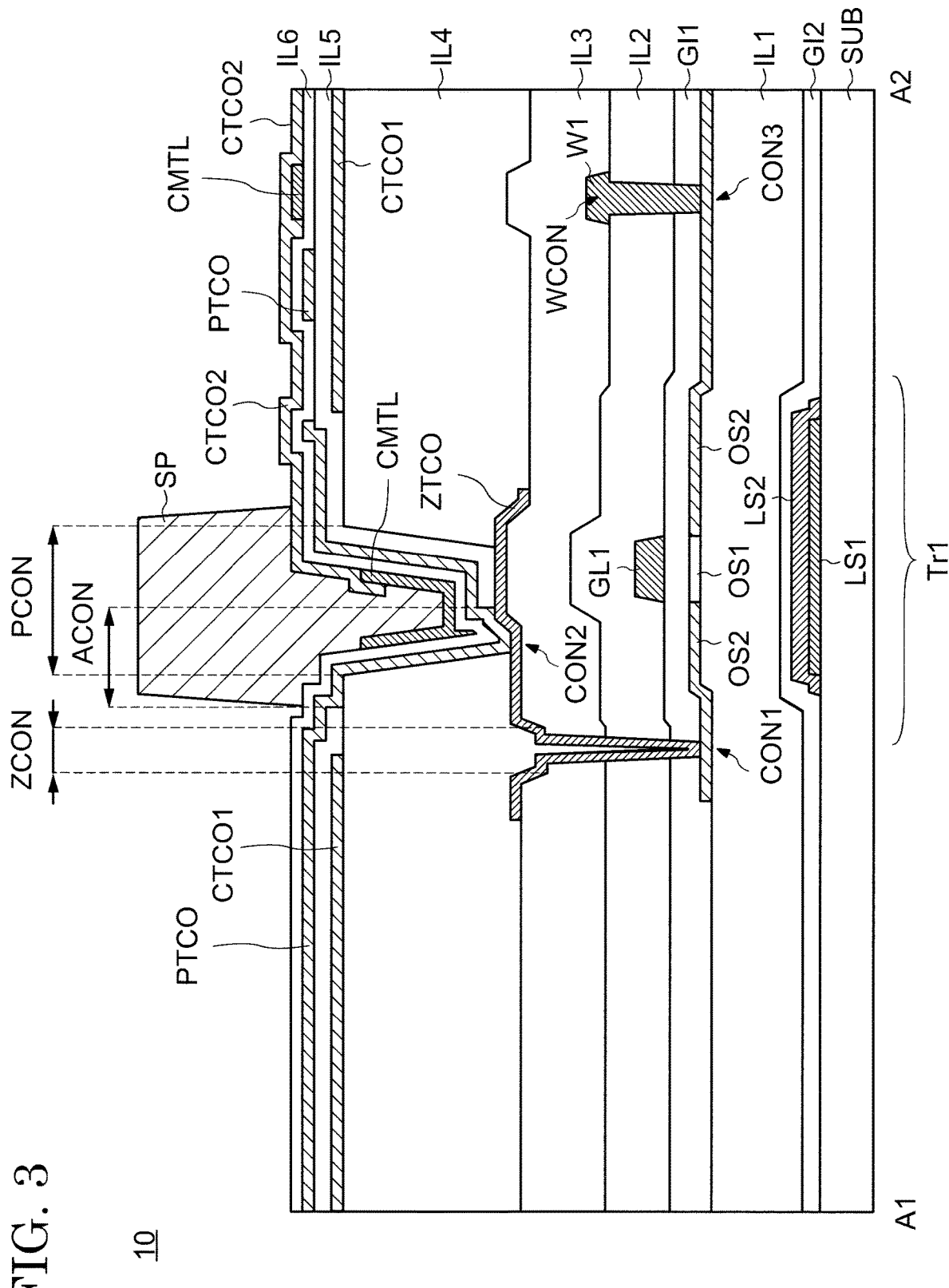
FIG. 3 is a cross-sectional view taken along a line A1-A2 of the display device shown in FIG. 2.

As shown in FIG. 1, the display device 10 includes a substrate SUB. The display device 10 includes a transistor Tr1, a transistor Tr2, a wiring W, a connecting electrode ZTCO, a pixel electrode PTCO, a common electrode CTCO1, a common auxiliary electrode CMTL, and a common electrode CTCO2. TCO is an abbreviation for Transparent Conductive Oxide. The transistor Tr1 is a transistor included in the pixel circuit of the display device 10. The transistor Tr2 is a transistor included in a peripheral circuit. Although details will be described later, the peripheral circuit is a circuit for driving the pixel circuit. The cross-sectional view of FIG. 1 is a diagram for explaining a layer structure of the display device 10, the peripheral circuit and the pixel circuit are shown adjacently, and it is needless to say that the pixel circuit is actually provided in a display area, the peripheral circuit is provided in a frame area outside the display area and these circuits are provided apart from each other. Particularly, the pixel circuit in FIG. 1 is shown centered on a contact hole peripheral part in a pixel area, and only a part of a transparent area (opening area) contributing to the display is shown. The transparent area is shown in FIG. 3.

[1-2. Configuration of Transistor Tr1]

The transistor Tr1 has an oxide semiconductor layer OS, a gate insulating layer GI1, and a gate electrode GL1. The gate electrode GL1 faces the oxide semiconductor layer OS. The gate insulating layer GI1 is provided between the oxide semiconductor layer OS and the gate electrode GL1. In the present embodiment, although a top gate type transistor in which the oxide semiconductor layer OS is provided closer to the substrate SUB than the gate electrode GL1 is exemplified, a bottom gate type transistor in which a positional relationship between the gate electrode GL1 and the oxide semiconductor layer OS is reversed may be used as the display device.

The oxide semiconductor layer OS includes oxide semiconductor layers OS1, OS2. The oxide semiconductor layer OS1 is an area overlapping the gate electrode GL1 in a plan view. The oxide semiconductor layer OS1 functions as a semiconductor layer and is switched between a conductive state and a non-conductive state according to a voltage supplied to the gate electrode GL1. That is, the oxide semiconductor layer OS1 functions as a channel for the transistor Tr1. The oxide semiconductor layer OS2 functions as a conductive layer. The oxide semiconductor layers OS1, OS2 are formed from the same oxide semiconductor layer. For example, the oxide semiconductor layer OS2 is a low resistance oxide semiconductor layer formed by doping impurities into a layer which has the same physical properties as the oxide semiconductor layer OS1. An insulating layer IL2 is provided above the gate electrode GL1. A wiring W1 is provided above the insulating layer IL2. The wiring W1 is connected to the oxide semiconductor layer OS2 via an opening WCON provided in the insulating layer IL2 and the gate insulating layer GI1. An area where the wiring W1 and the oxide semiconductor layer OS2 are in contact with each other is referred to as a third contact area CON3. The third contact area CON3 is provided in the opening WCON. The wiring W1 is in contact with the oxide semiconductor layer OS2 in the third contact area CON3 not overlapping the gate electrode GL1 in a plan view. A data signal related to pixel gradation is transmitted to the wiring W1. An insulating layer IL3 is provided above the insulating layer IL2 and the wiring W1. The connecting electrode ZTCO (also referred to as the first transparent conductive layer) is provided above the insulating layer IL3. The connecting electrode ZTCO is connected to the oxide semiconductor layer OS2 via an opening ZCON provided in the insulating layers IL3, IL2, and the gate insulating layer GI1. The connecting electrode ZTCO is in contact with the oxide semiconductor layer OS2 at the bottom of the opening ZCON. The connecting electrode ZTCO is a transparent conductive layer.

An area where the connecting electrode ZTCO and the oxide semiconductor layer OS2 are in contact with each other is referred to as a first contact area CON1. The first contact area CON1 is provided in the opening ZCON. Although described in detail later, the connecting electrode ZTCO is in contact with the oxide semiconductor layer OS2 in the first contact area CON1 not overlapping the gate electrode GL1 and the wiring W1 in a plan view. The first contact area CON1 is included in the display area of a pixel in a plan view. The connecting electrode ZTCO does not overlap the third contact area CON3.

For example, when a transparent conductive layer such as an ITO layer is formed in contact with a semiconductor layer such as a silicon layer, a surface of the semiconductor layer is oxidized by a process gas or oxygen ions at the time of deposition of an ITO film. Since an oxide layer formed on the surface of the semiconductor layer is high resistance, a contact resistance between the semiconductor layer and the transparent conductive layer is increased. As a result, there is a defect in an electrical contact between the semiconductor layer and the transparent conductive layer. On the other hand, even if the above transparent conductive layer is formed so as to be in contact with the oxide semiconductor layer, a high resistance oxide layer as described above is not formed on a surface of the oxide semiconductor layer. Therefore, there is no defect in the electrical contact between the oxide semiconductor layer and the transparent conductive layer.

An insulating layer IL4 is provided above the connecting electrode ZTCO. The insulating layer IL4 releases (relieves) a step formed from a structure provided below the insulating layer IL4. The insulating layer IL4 may be referred to as a flattened film. The common electrode CTCO1 (also referred to as a third transparent conductive layer) is provided above the insulating layer IL4. In FIG. 1, although a state in which the common electrode CTCO1 is provided in a drive circuit is shown, the common electrode CTCO1 is also provided in the pixel. The common electrode CTCO1 provided in the pixel will be described later in detail. An insulating layer IL5 (also referred to as a first insulating layer) is provided above the common electrode CTCO1. The pixel electrode PTCO (also referred to as a second transparent conductive layer) is provided above the insulating layer IL5. The common electrode CTCO1 faces the pixel electrode PTCO via the insulating layer IL5, thereby configuring a storage capacitor (see FIG. 3). The pixel electrode PTCO is connected to the connecting electrode ZTCO via an opening ACON provided in the insulating layer IL5 and an opening PCON provided in the insulating layer IL4. An area where the connecting electrode ZTCO and the pixel electrode PTCO are in contact with each other is referred to as a second contact area CON2. The second contact area CON2 is provided in an area where the opening PCON and the opening ACON overlap. In a plan view, the second contact area CON2 overlaps the gate electrode GL1. The pixel electrode PTCO is a transparent conductive layer. An insulating layer IL6 is provided above the pixel electrode PTCO. The thickness of the insulating layer IL6 is smaller than the thickness of the insulating layer IL5. The thickness of the insulating layer IL6 may be substantially the same as the thickness of the insulating layer IL5.

The common auxiliary electrode CMTL and the common electrode CTCO2 (also referred to as a fourth transparent conductive layer) are provided above the insulating layer IL6. As will be described in detail later, the common auxiliary electrode CMTL and the common electrode CTCO2 have different plane patterns. The common auxiliary electrode CMTL is a metal layer. The common electrode CTCO2 is a transparent conductive layer. The common electrode CTCO2 faces the pixel electrode PTCO via the insulating layer IL6, thereby configuring a storage capacitor (see FIG. 3). The electric resistance of the common auxiliary electrode CMTL is lower than the electric resistance of the common electrode CTCO2. The common auxiliary electrode CMTL also functions as a light-shielding layer. For example, the common auxiliary electrode CMTL shields light from adjacent pixels to suppress color mixing from occurring. The common electrode CTCO2 is electrically connected to the common electrode CTCO1 in a peripheral area. A spacer SP is provided above the common electrode CTCO2. The spacer SP overlaps at least the second contact area CON2 and fills the second contact area CON2. The spacer SP may overlap the gate electrode GL1 and a pixel electrode PCTO.

The same potential is supplied to the common electrode CTCO1, the common auxiliary electrode CMTL, and the common electrode CTCO2. The potential is preferably a reference potential relative to a pixel potential supplied to the pixel electrode PTCO. Therefore, an electric field is formed between the common electrode CTCO2 and the pixel electrode PTCO via a slit of the common electrode CTCO2 as described above (see FIG. 16), and a storage capacitor based on the pixel potential is formed between the pixel electrode PTCO and the common electrodes CTCO1, CTCO2 facing each other as described above.

The spacer SP is provided for a part of the pixels. For example, the spacer SP may be provided for any one pixel of a blue pixel, a red pixel, and a green pixel. However, the spacer SP may be provided for all the pixels. A height of the spacer SP is half a height of a cell gap. A spacer is also provided on a counter substrate, and the spacer on the counter substrate and the above spacer SP overlap in a plan view.

The spacer SP can adopt not only such a structure but also a structure having a height corresponding to the cell gap and can adopt a structure of simply filling the second contact area CON2.

A light-shielding layer LS is provided between the transistor Tr1 and the substrate SUB. In the present embodiment, light-shielding layers LS1, LS2 are provided as the light-shielding layer LS. However, the light-shielding layer LS may be formed of only the light-shielding layer LS1 or LS2. In a plan view, the light-shielding layer LS is provided in an area where the gate electrode GL1 and the oxide semiconductor layer OS overlap. In a plan view, the light-shielding layer LS is provided in an area overlapping the oxide semiconductor layer OS1. The light-shielding layer LS suppresses the light incident from the substrate SUB side from reaching the oxide semiconductor layer OS1. In the case where a conductive layer is used as the light-shielding layer LS, a voltage may be applied to the light-shielding layer LS to control the oxide semiconductor layer OS1. In the case where a voltage is applied to the light-shielding layer LS, the light-shielding layer LS and the gate electrode GL1 may be connected in a peripheral area of the pixel circuit. In a plan view, the above third contact area CON3 and the first contact area CON1 are provided in an area not overlapping the light-shielding layer LS and the gate electrode GL1.

[1-3. Configuration of Transistor Tr2]

The transistor Tr2 has a p-type transistor Tr2-1 and an n-type transistor Tr2-2.

The p-type transistor Tr2-1 and the n-type transistor Tr2-2 both include a gate electrode GL2, a gate insulating layer GI2, and a semiconductor layer S. The gate electrode GL2 faces the semiconductor layer S. The gate insulating layer GI2 is provided between the semiconductor layer S and the gate electrode GL2. In the present embodiment, although a bottom gate type transistor in which the gate electrode GL2 is provided closer to the substrate SUB than the semiconductor layer S is exemplified, a top gate type transistor in which a positional relationship between the semiconductor layer S and the gate electrode GL2 is reversed may be used as the display device.

The semiconductor layer S of the p-type transistor Tr2-1 includes the semiconductor layers S1, S2. The semiconductor layer S of the n-type transistor Tr2-2 includes the semiconductor layers S1, S2, and S3. The semiconductor layer S1 is a semiconductor layer overlapping the gate electrode GL2 in a plan view. The semiconductor layer S1 functions as a channel for the transistors Tr2-1 and Tr2-2. The semiconductor layer S2 functions as a conductive layer. The semiconductor layer S3 functions as a conductive layer with a higher resistance than the semiconductor layer S2. The semiconductor layer S3 suppresses hot carrier degradation by attenuating hot carriers intruding toward the semiconductor layer S1.

An insulating layer IL1 and the gate insulating layer GI1 are provided on the semiconductor layer S. In the transistor Tr2, the gate insulating layer GI1 simply functions as an interlayer film. A wiring W2 is provided above these insulating layers. The wiring W2 is connected to the semiconductor layer S via an opening provided in the insulating layer IL1 and the gate insulating layer GI1.

The insulating layer IL2 is provided on the wiring W2. The wiring W1 is provided on the insulating layer IL2. The wiring W1 is connected to the wiring W2 via an opening provided in the insulating layer IL2. The gate electrode GL2 and the light-shielding layer LS2 are the same layer. The wiring W2 and the gate electrode GL1 are the same layer. The same layer means that multiple members are formed from one patterned layer.

[1-4. Plane Layout of Display Device 10]

Figure 2:
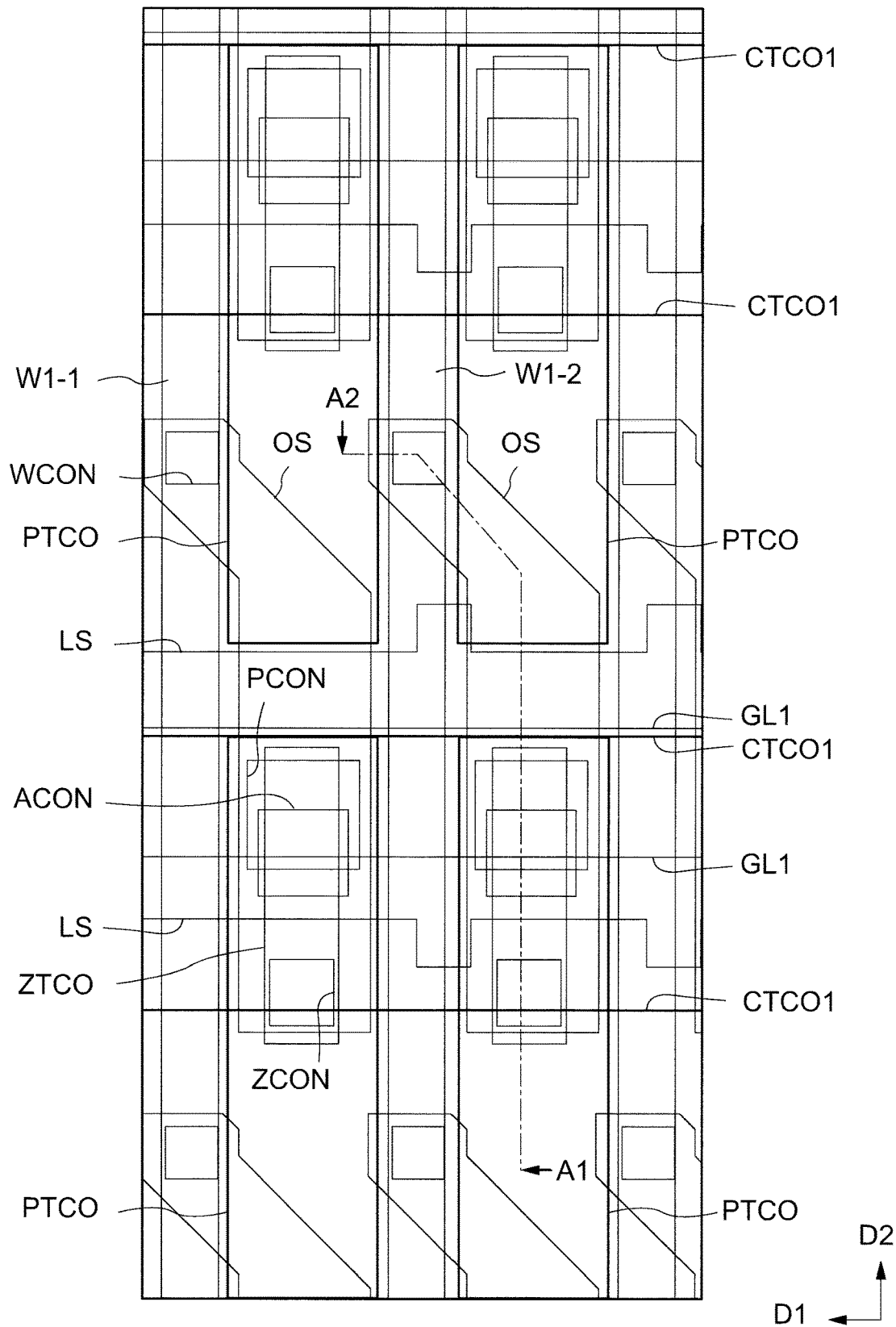
FIG. 2 is a plan view showing an outline a display device according to an embodiment of the present invention.
Figure 14:
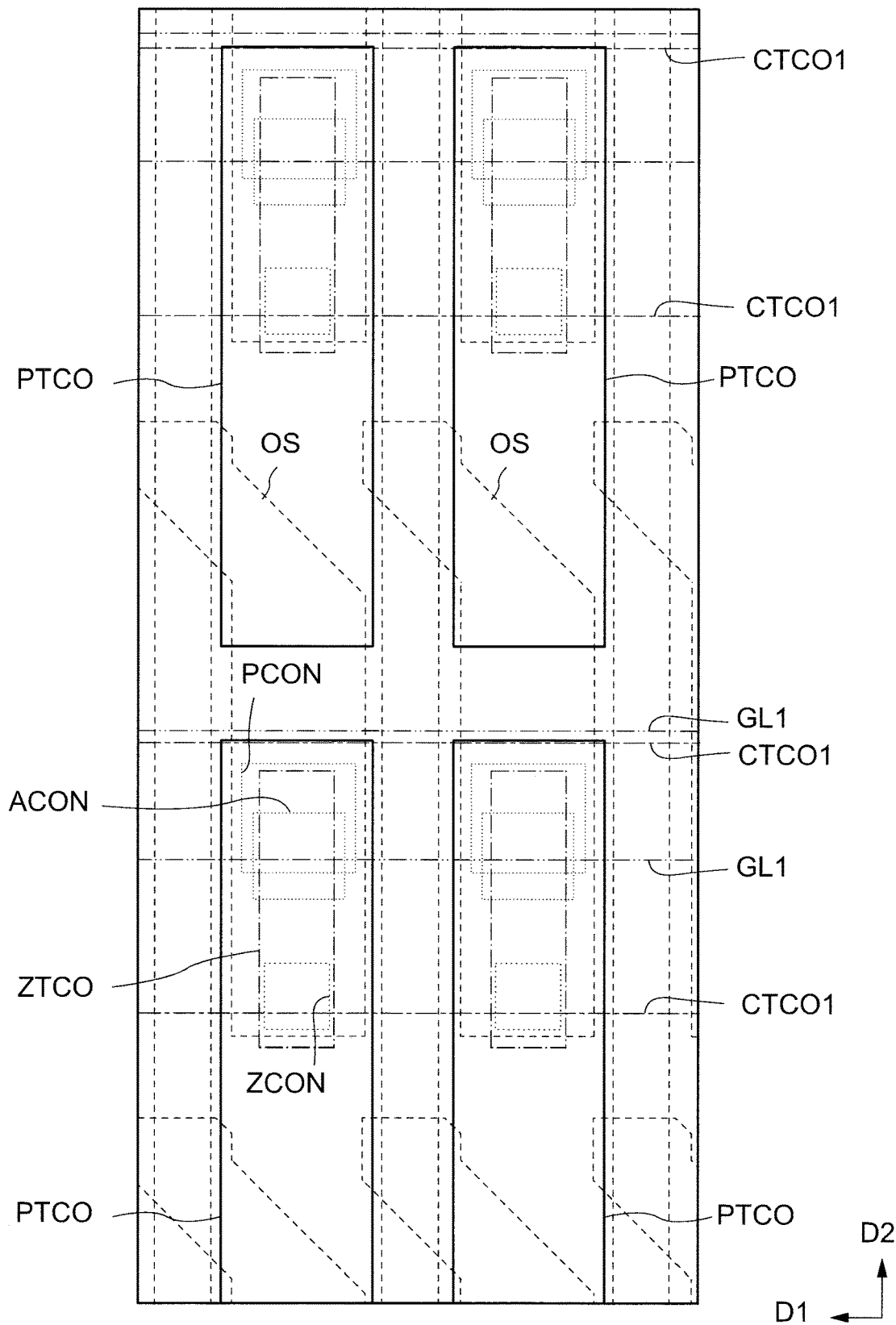
FIG. 14 is a plan view illustrating a layout of one or more layers in a display device according to an embodiment of the present invention.
Figure 15:
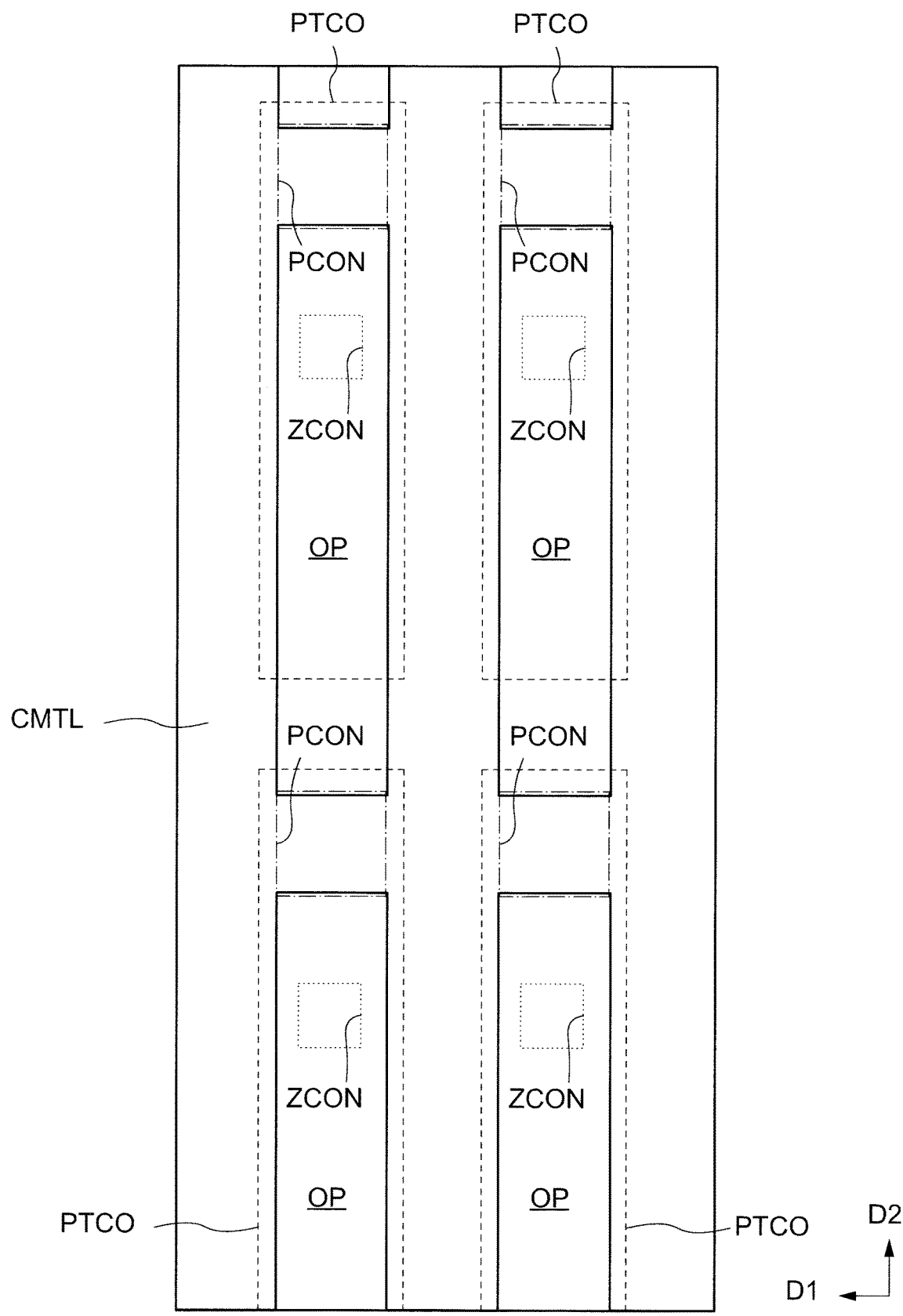
FIG. 15 is a plan view illustrating a layout of one or more layers in a display device according to an embodiment of the present invention.
Figure 16:
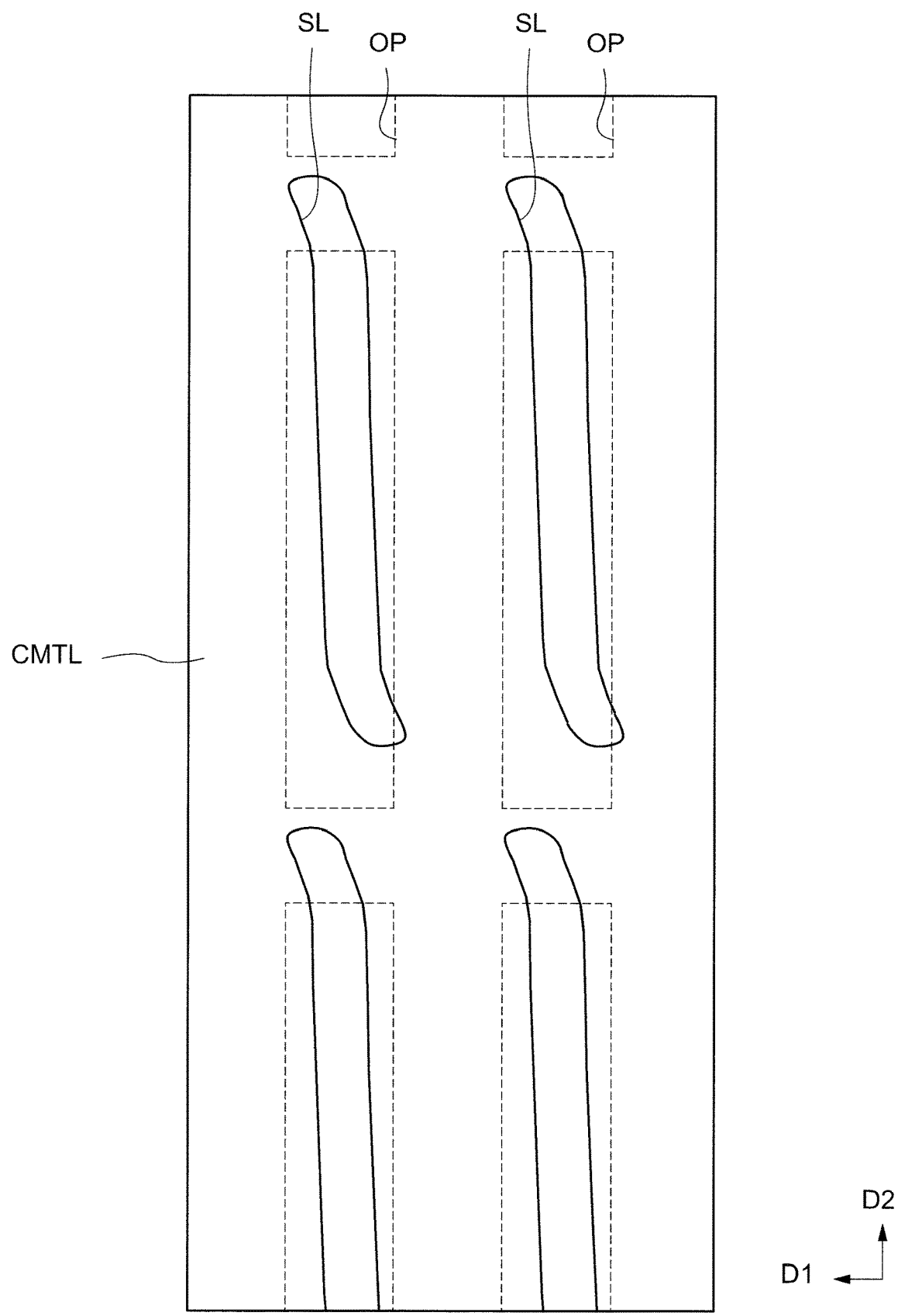
FIG. 16 is a plan view illustrating a layout of one or more layers in a display device according to an embodiment of the present invention.

A plane layout of a pixel of the display device 10 will be described with reference to FIG. 2, FIG. 4 to FIG. 16. FIG. 3 is a cross-sectional view of the display device 10 shown in FIG. 2 taken along a line A1-A2. In FIG. 2, the common auxiliary electrode CMTL, the common electrode CTCO2, and the spacer SP are omitted. The plane layouts of the pixel electrode PTCO, the common auxiliary electrode CMTL, and the common electrode CTCO2 are shown in FIG. 14 to FIG. 16, respectively. In FIG. 2 to FIG. 16, positions where the openings are provided for the insulating layer IL1 to the insulating layer IL6, are shown.

Figure 4:
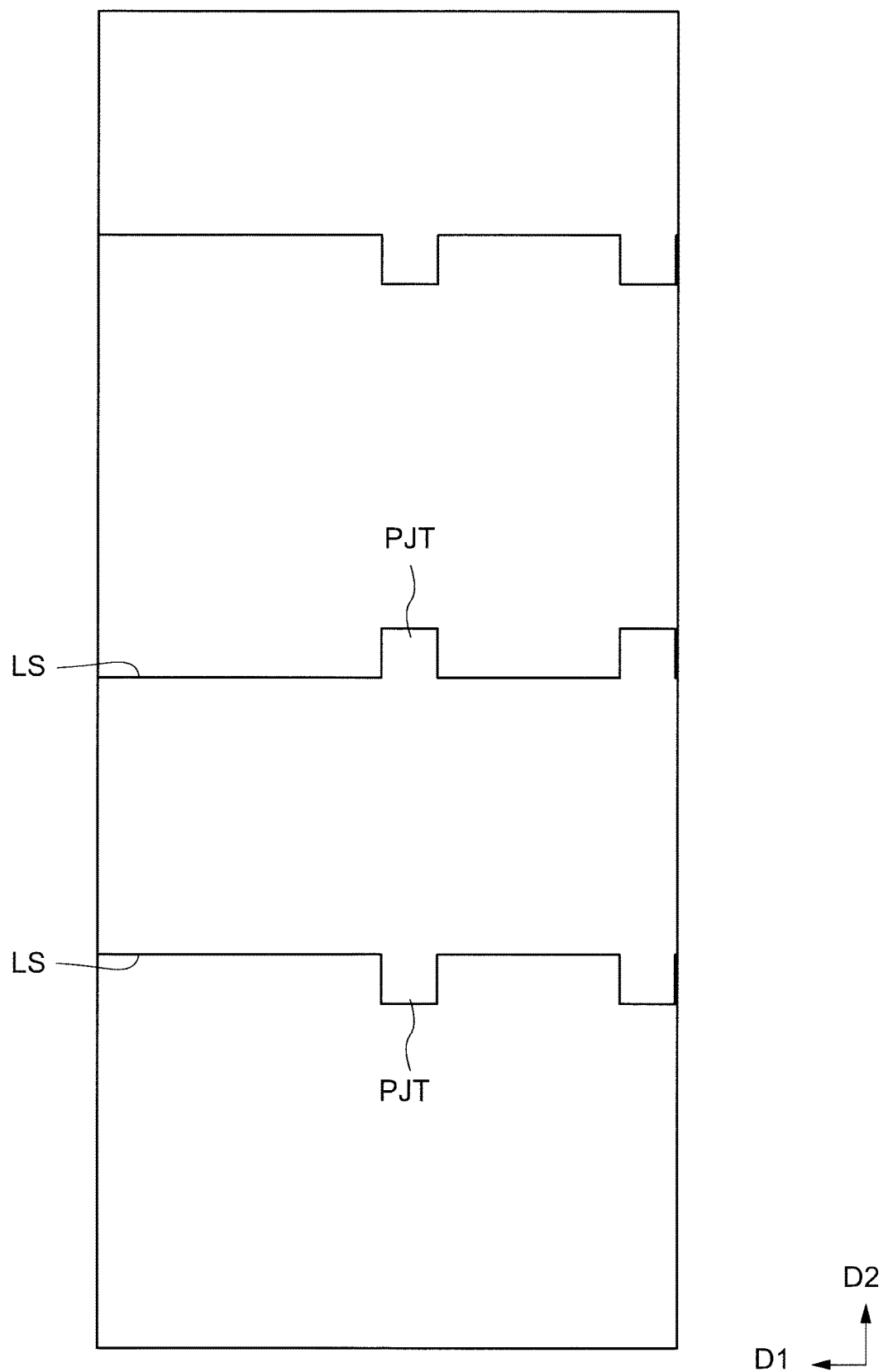
FIG. 4 is a plan view illustrating a layout of one or more layers in a display device according to an embodiment of the present invention.

As shown in FIG. 2 and FIG. 4, the light-shielding layer LS extends in the direction D1. A shape of the light-shielding layer LS may be different depending on the pixel. In the present embodiment, a protruding part PJT protruding in the direction D2 is provided from a part of the light-shielding layer LS extending in the direction D1.

Figure 5:
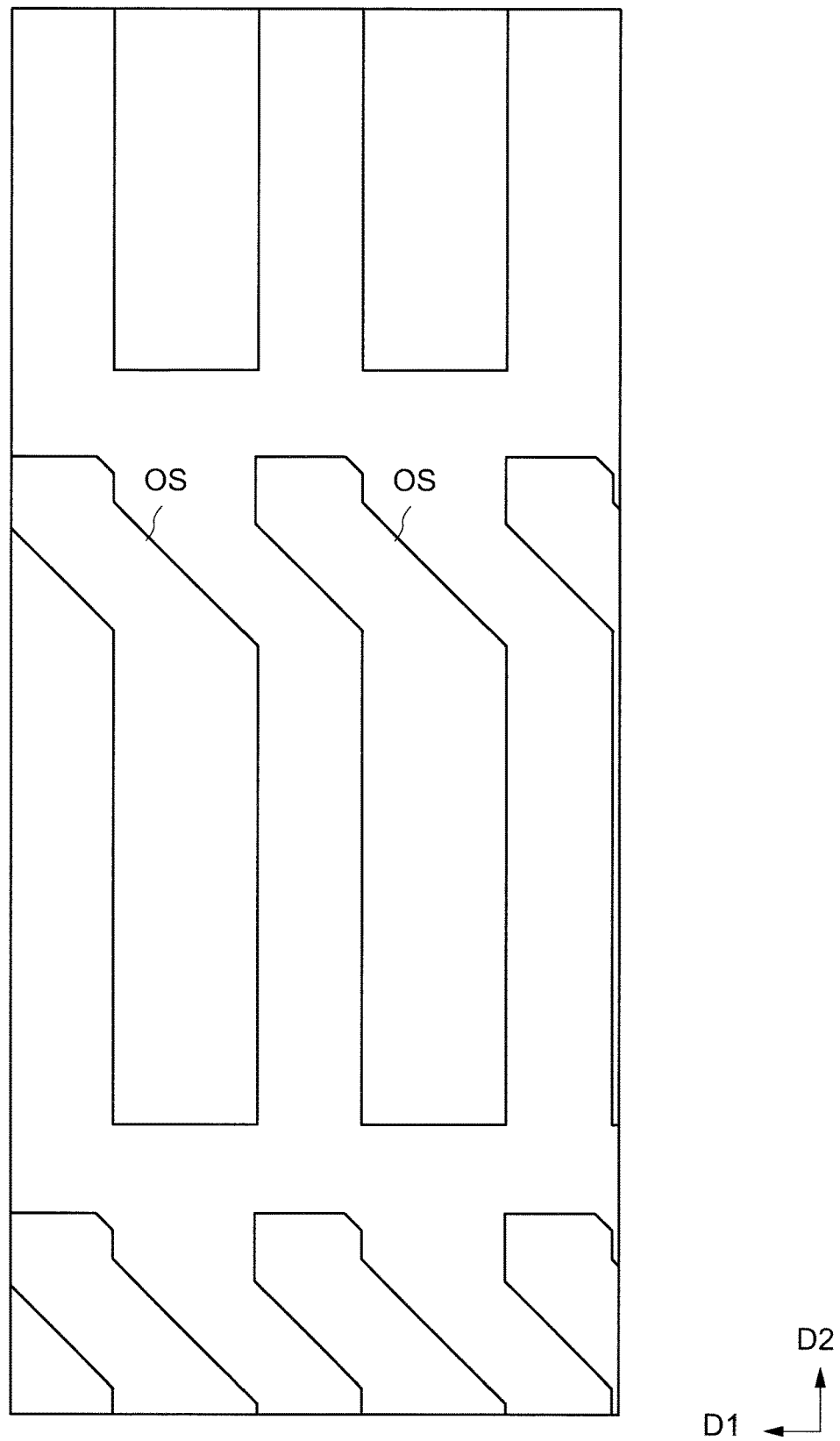
FIG. 5 is a plan view illustrating a layout of one or more layers in a display device according to an embodiment of the present invention.

As shown in FIG. 2 and FIG. 5, the oxide semiconductor layer OS extends in the direction D2. The gate electrode GL1 extends in the direction D1 so as to intersect the oxide semiconductor layer OS.

Figure 6:
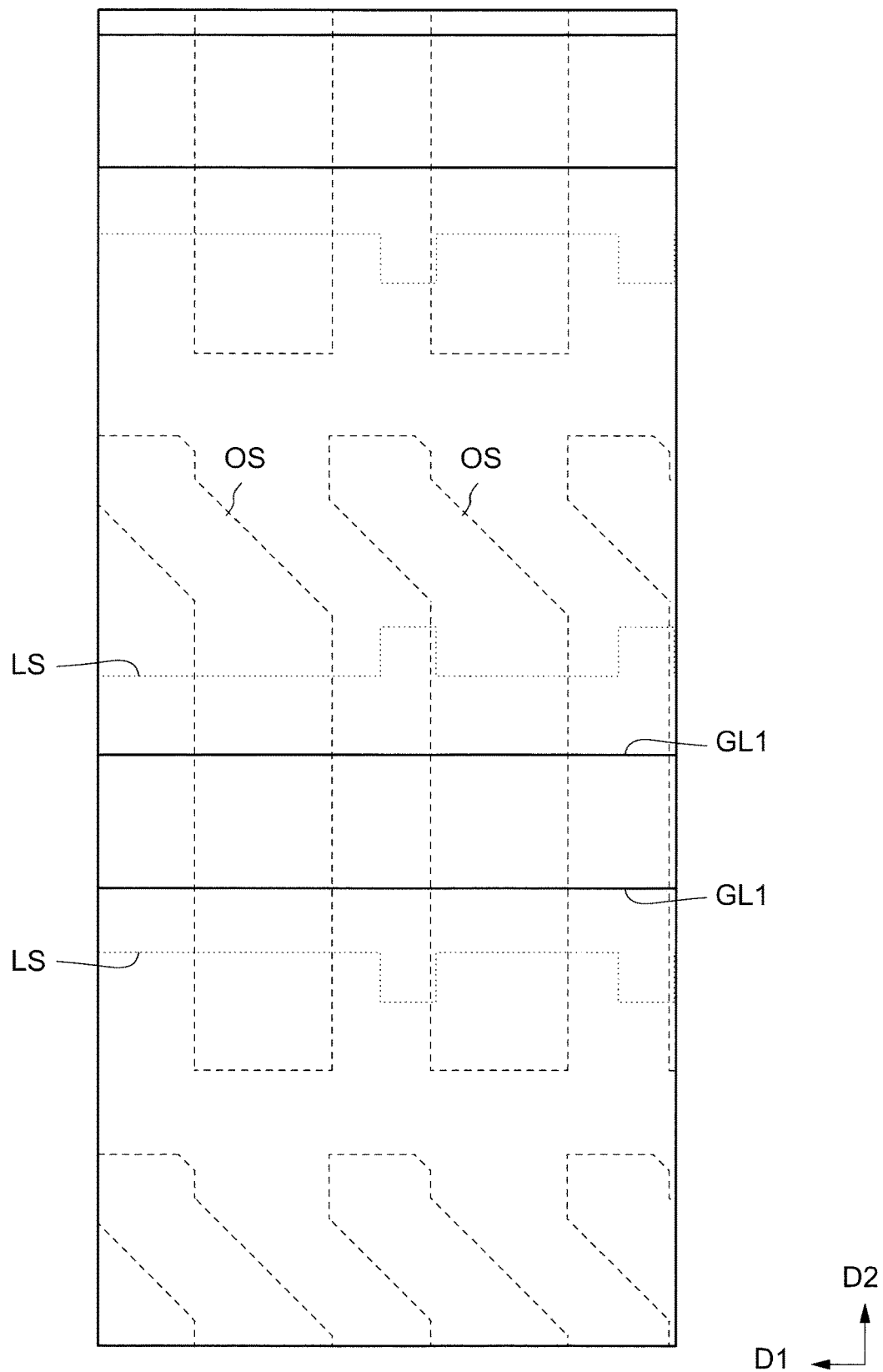
FIG. 6 is a plan view illustrating a layout of one or more layers in a display device according to an embodiment of the present invention.

As shown in FIG. 2 and FIG. 6, a pattern of the gate electrode GL1 is provided inside a pattern of the light-shielding layer LS. In other words, the oxide semiconductor layer OS is formed in a long shape intersecting the gate electrode GL1. As shown in FIG. 6, the light-shielding layer LS is provided in an area including the area where the gate electrode GL1 and the oxide semiconductor layer OS overlap in a plan view. The gate electrode GL1 can also be referred to as a "gate line".

Figure 7:
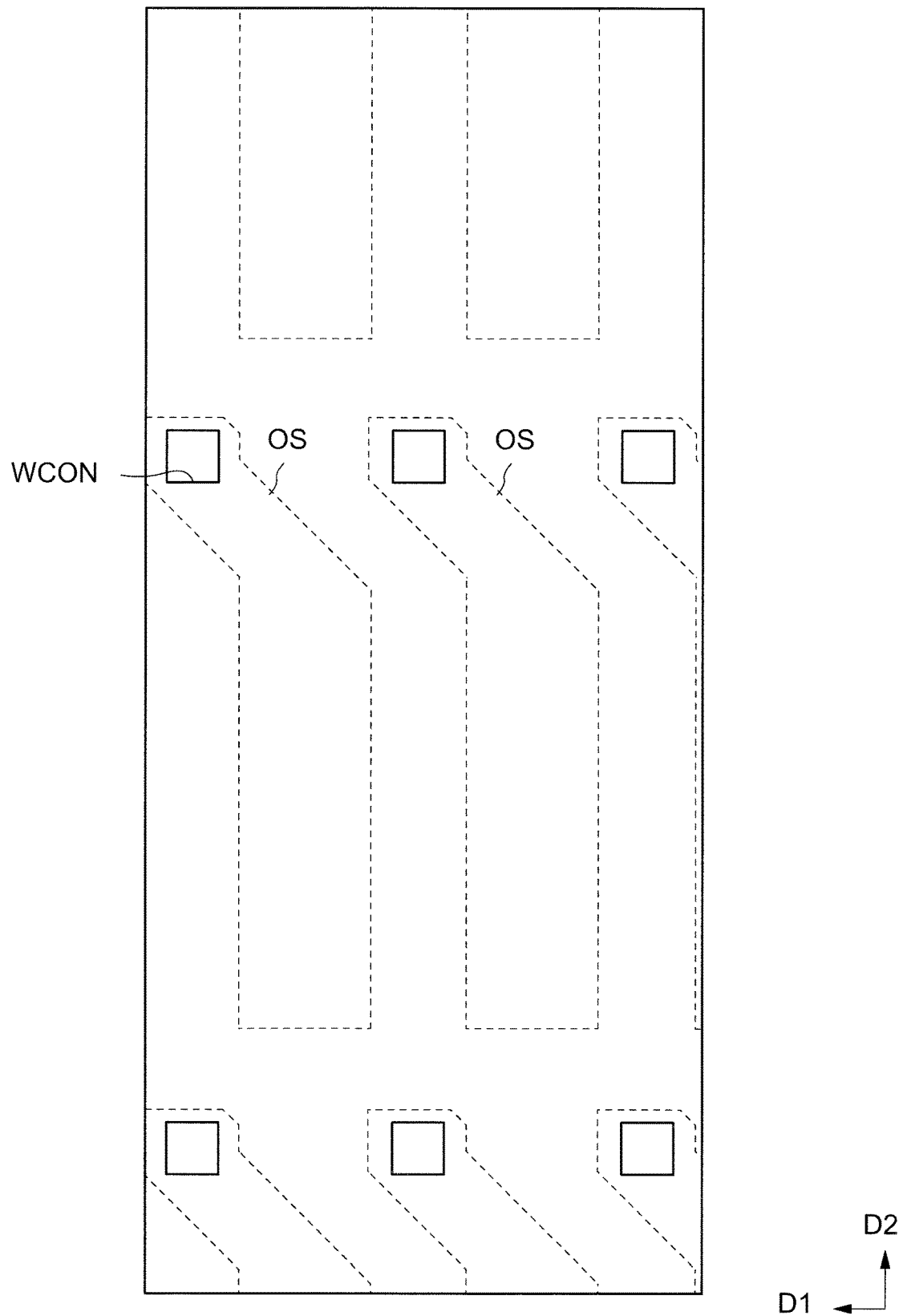
FIG. 7 is a plan view illustrating a layout of one or more layers in a display device according to an embodiment of the present invention.

As shown in FIG. 2 and FIG. 7, the opening WCON is provided near an upper end of the pattern of the oxide semiconductor layer OS. The opening WCON is provided in the gate insulating layer GI1 and the insulating layer IL2. The opening WCON is provided in an area overlapping the pattern of the oxide semiconductor layer OS and not overlapping the gate electrode GL1.

Figure 8:
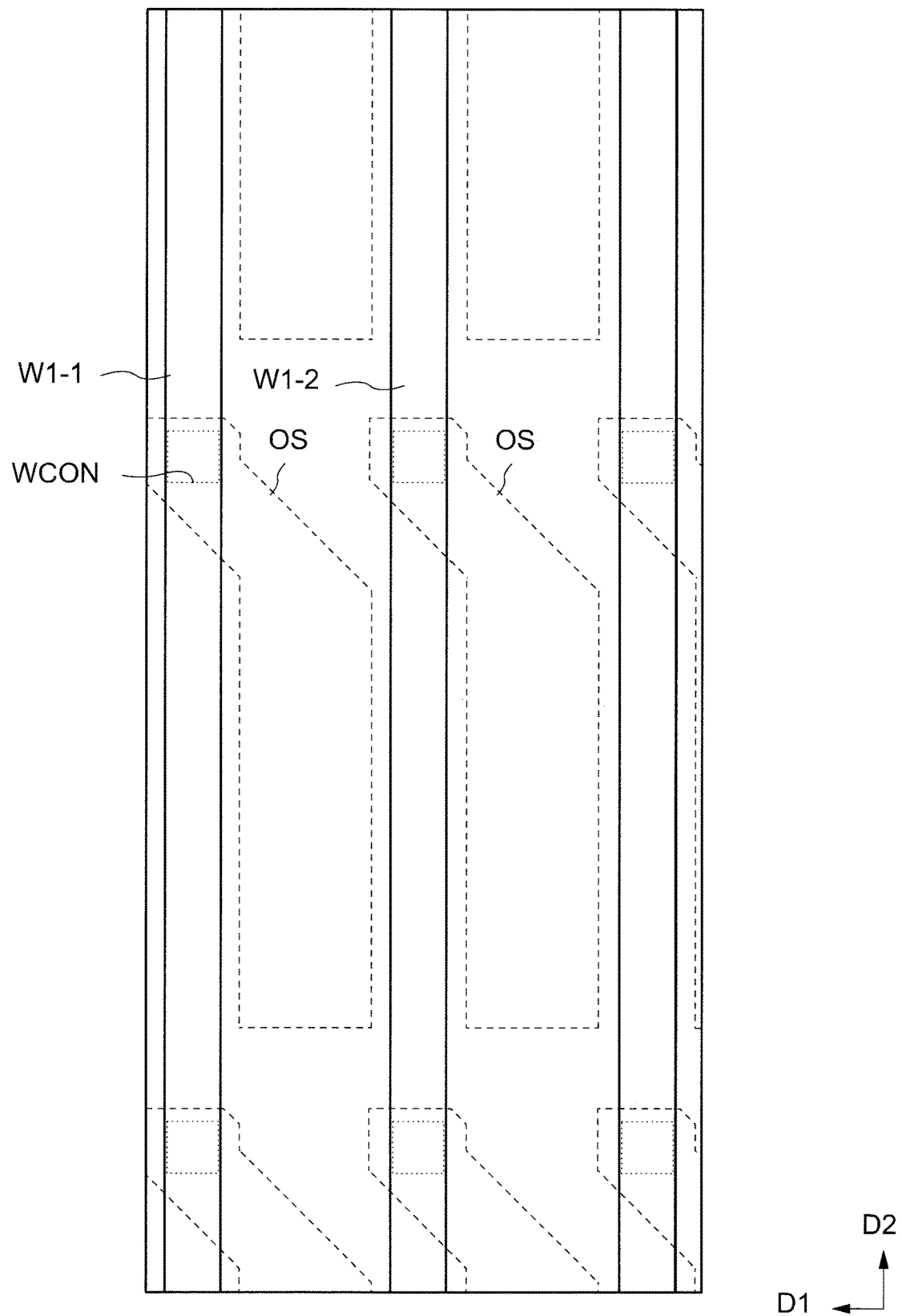
FIG. 8 is a plan view illustrating a layout of one or more layers in a display device according to an embodiment of the present invention.

As shown in FIG. 2 and FIG. 8, a plurality of wirings W1 extends in the direction D2. The wiring W1 is provided in an area overlapping the oxide semiconductor layer OS in the opening WCON (the third contact area CON3). In the case where the adjacent wirings need to be described separately, the adjacent wiring W1 is referred to as a wiring W1-1 (first wiring) and a wiring W1-2 (second wiring). In this case, a main part of the oxide semiconductor layer OS extends in the direction D2 between the first the wiring W1-1 and the second the wiring W1-2 and intersects the gate electrode GL1. The main part of the pattern of the oxide semiconductor layer OS extends in the direction D2 between a pair of the adjacent wirings W1. The remaining part of the pattern of the oxide semiconductor layer OS extends obliquely in the directions D1 and D2 from the main part toward an area of the opening WCON.

Figure 9:
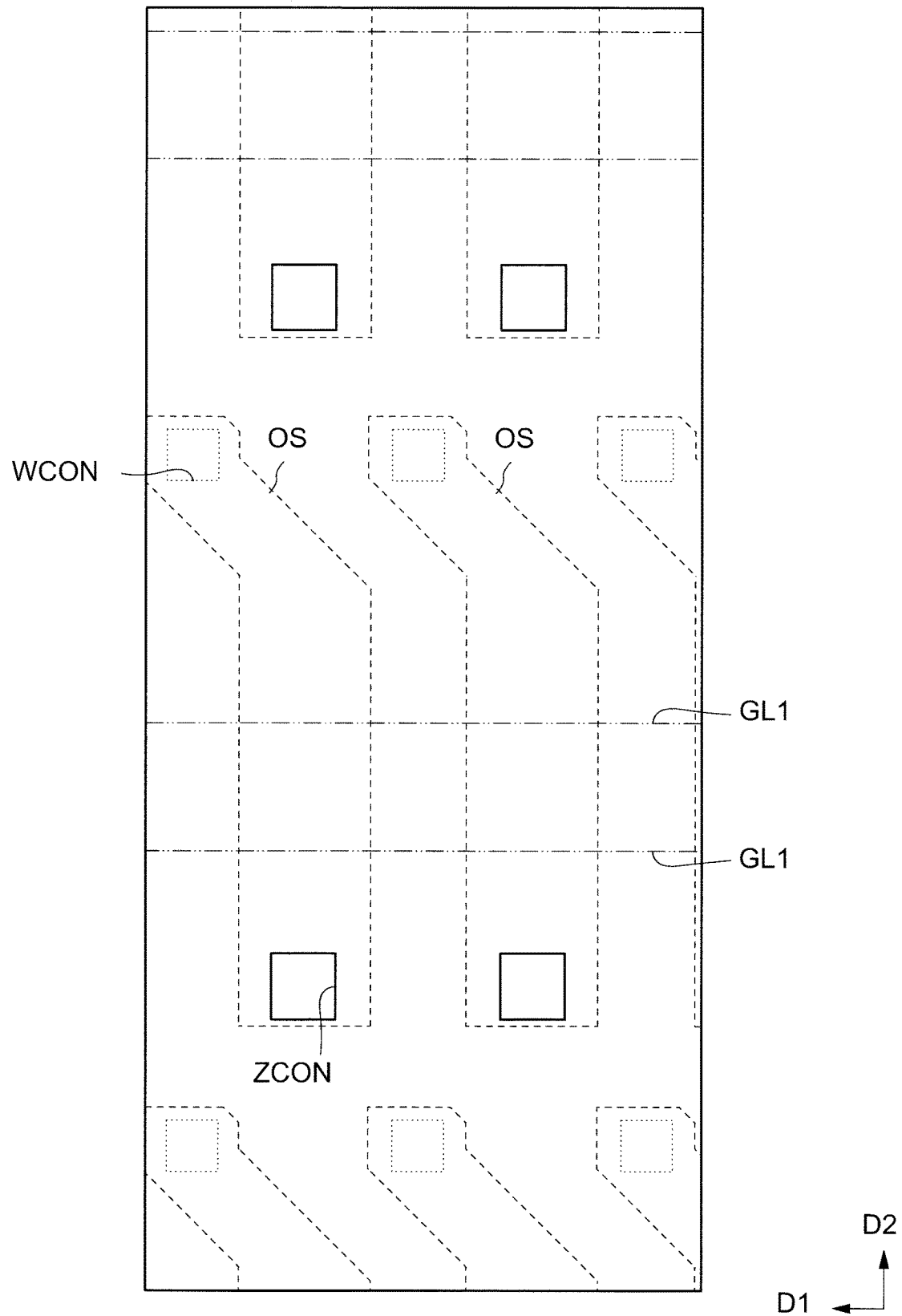
FIG. 9 is a plan view illustrating a layout of one or more layers in a display device according to an embodiment of the present invention.

As shown in FIG. 2 and FIG. 9, the opening ZCON is provided near a lower end of the pattern of the oxide semiconductor layer OS. The opening ZCON is provided in the gate insulating layer GI1, the insulating layer IL2, and the insulating layer IL3. The opening ZCON is provided in an area overlapping the pattern of the oxide semiconductor layer OS and not overlapping the gate electrode GL1. The oxide semiconductor layer OS is in contact with the wiring W1 at the opposite side of the opening ZCON (the first contact area CON1) with respect to the gate electrode GL1. The opening ZCON (the first contact area CON1) does not overlap the light-shielding layer LS.

In other words, the oxide semiconductor layer OS is connected to the connecting electrode ZTCO at the other end in the longitudinal direction of the oxide semiconductor layer OS. The connecting electrode ZTCO is formed in a long shape extending in the direction D2 similar to the oxide semiconductor layer OS. In the direction D1, a width of the connecting electrode ZTCO is smaller than a width of the oxide semiconductor layer OS.

Figure 10:
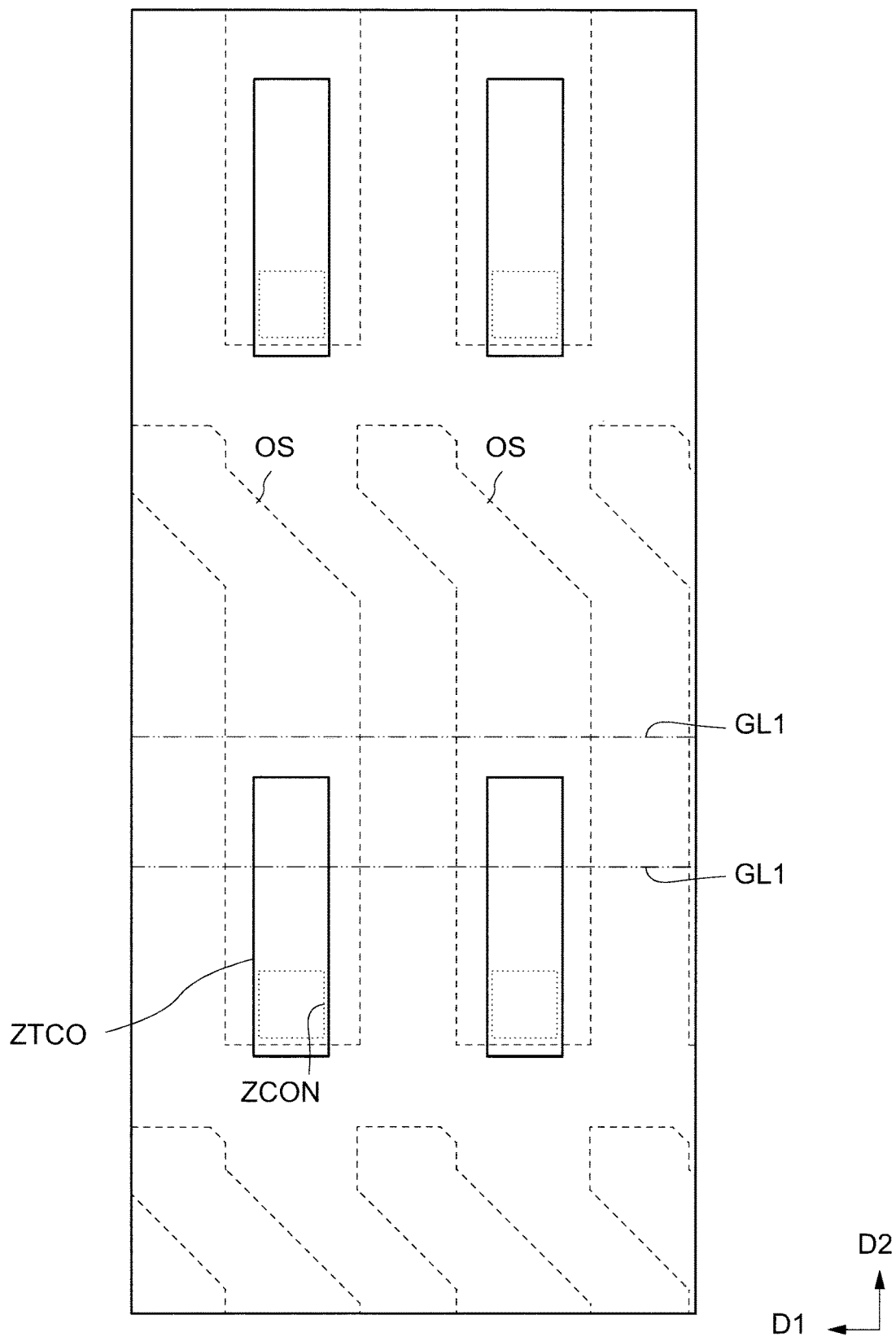
FIG. 10 is a plan view illustrating a layout of one or more layers in a display device according to an embodiment of the present invention.

As shown in FIG. 2 and FIG. 10, the connecting electrode ZTCO is provided in an area overlapping the opening ZCON. The connecting electrode ZTCO overlaps the gate electrode GL1 and the oxide semiconductor layer OS between the wiring W1-1 and the wiring W1-2. Therefore, the connecting electrode ZTCO is in contact with the oxide semiconductor layer OS in the opening ZCON (the first contact area CON1) not overlapping the gate electrode GL1.

Figure 11:
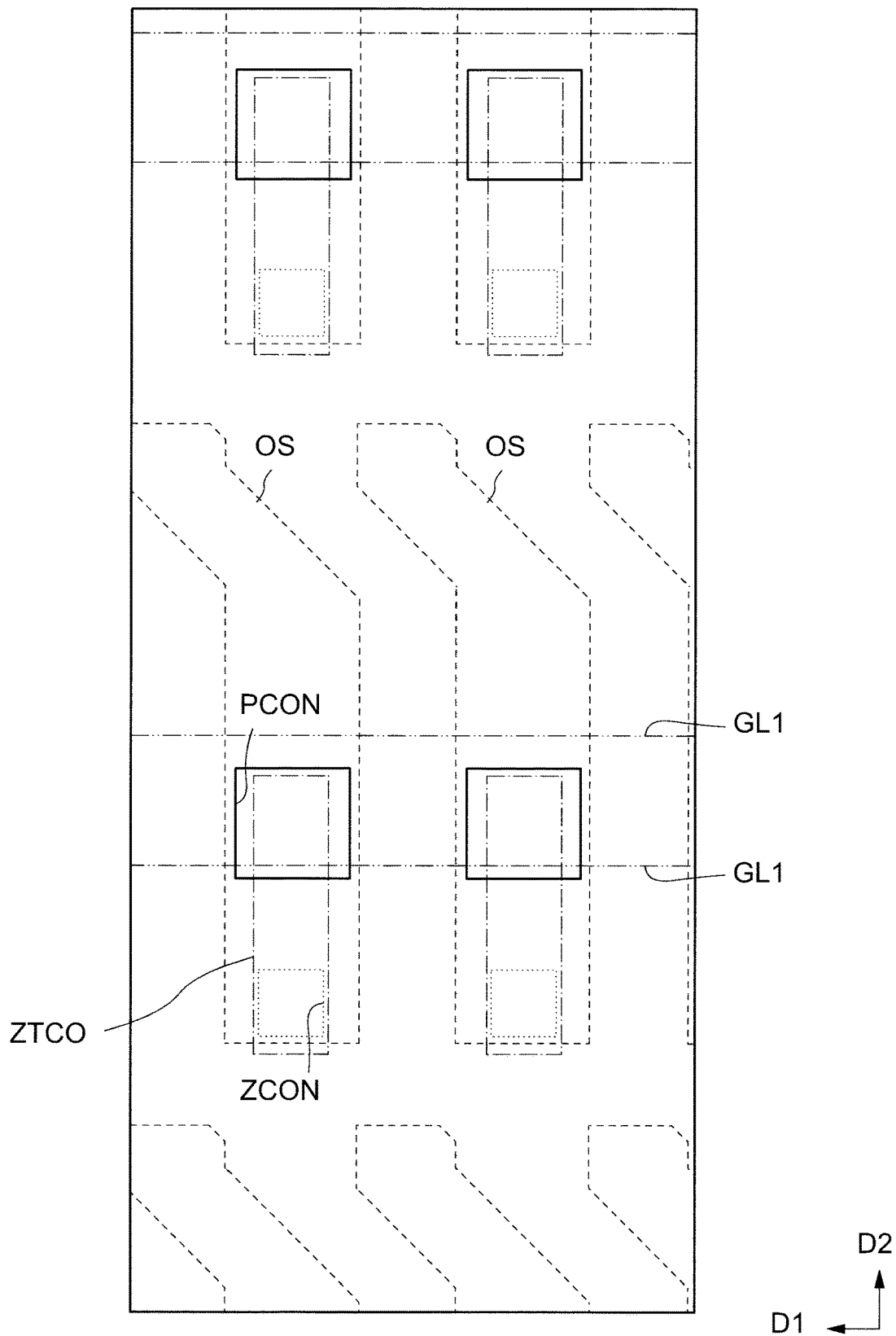
FIG. 11 is a plan view illustrating a layout of one or more layers in a display device according to an embodiment of the present invention.

As shown in FIG. 2 and FIG. 11, the opening PCON is provided near an upper end of the pattern of the connecting electrode ZTCO. The opening PCON is provided in the insulating layer IL4. The opening PCON is provided in an area overlapping the pattern of the gate electrode GL1 and the pattern of the connecting electrode ZTCO.

Figure 12:
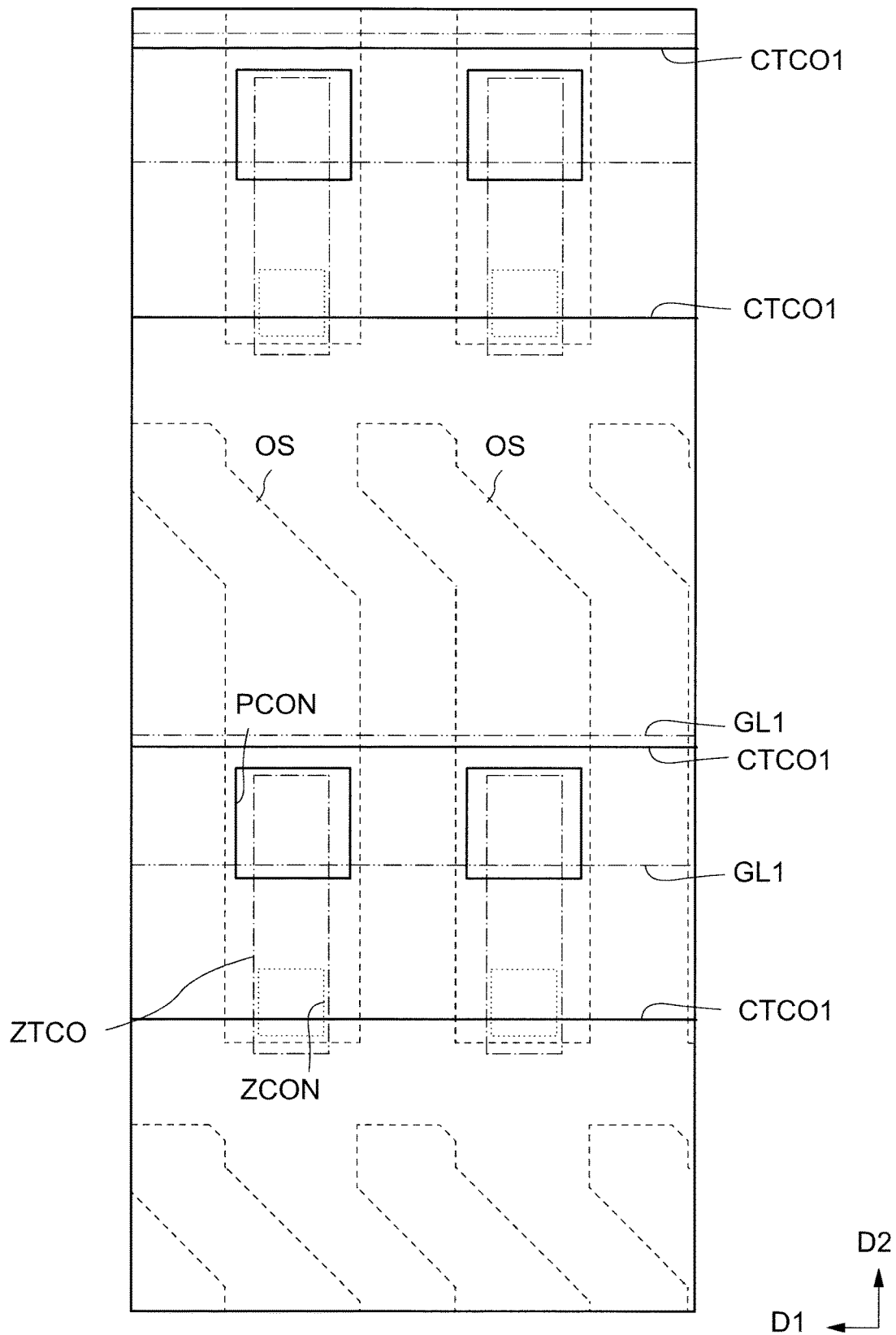
FIG. 12 is a plan view illustrating a layout of one or more layers in a display device according to an embodiment of the present invention.

As shown in FIG. 2 and FIG. 12, the common electrode CTCO1 has a plurality of stripe-shaped (rectangular-shaped) patterns in the display area. The common electrode CTCO1 is provided so as to overlap the wiring W1-1 and the wiring W1-2 along the direction D1. The common electrode CTCO1 overlaps the opening WCON (the third contact area CON3). The plurality of stripe-shaped common electrodes CTCO1 is electrically connected in the peripheral area where a drive circuit in the display device 10 is provided.

Figure 13:
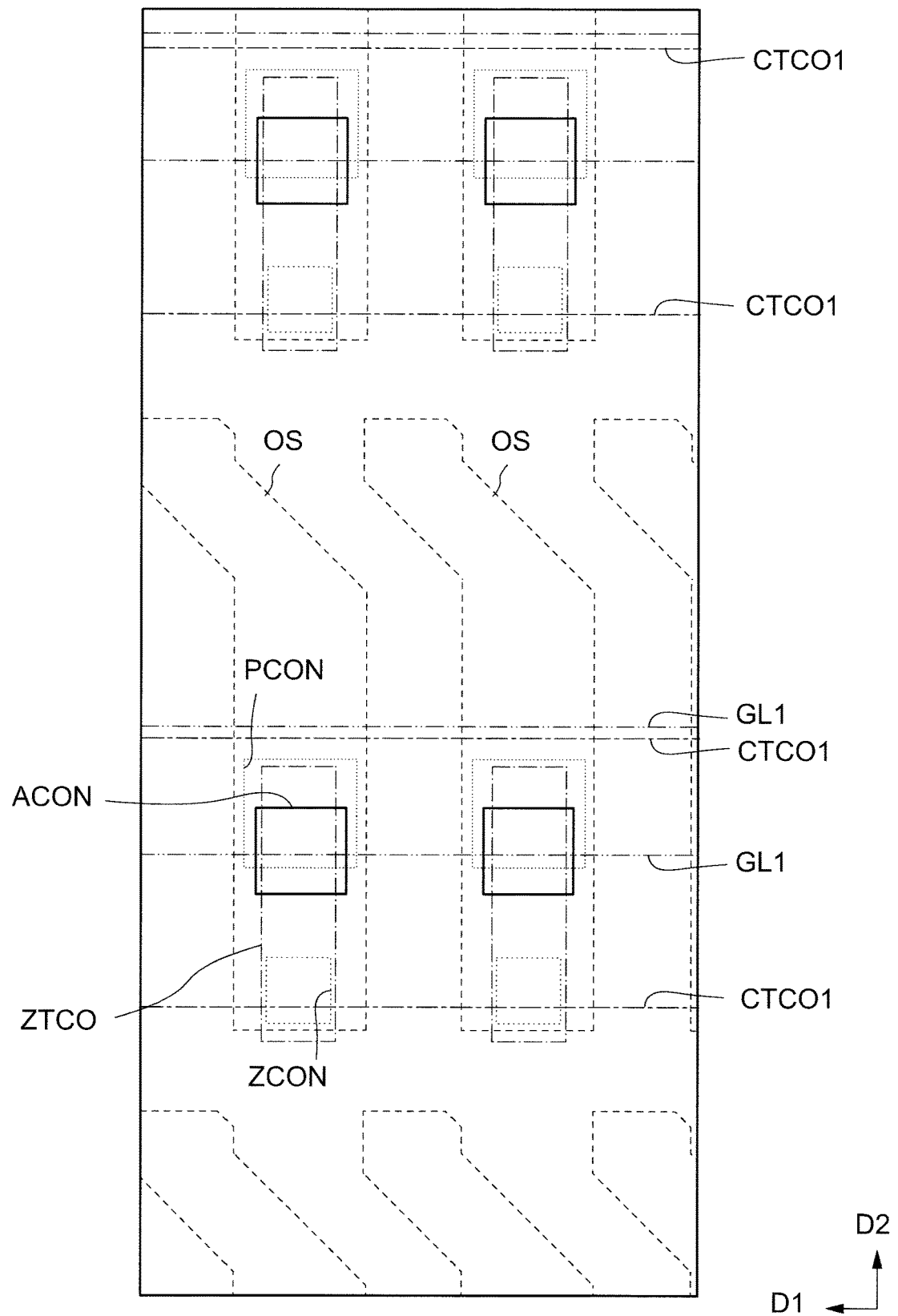
FIG. 13 is a plan view illustrating a layout of one or more layers in a display device according to an embodiment of the present invention.

As shown in FIG. 2 and FIG. 13, the opening ACON is provided so as to overlap the opening PCON. The opening ACON is provided in the insulating layer IL5. The opening ACON is provided so that at least a part thereof overlaps the gate electrode GL1.

As shown in FIG. 2 and FIG. 14, the pixel electrode PTCO overlaps the gate electrode GL1, the oxide semiconductor layer OS, and the connecting electrode ZTCO between the wiring W1-1 and the wiring W1-2. The pixel electrode PTCO is in contact with the connecting electrode ZTCO in the opening PCON overlapping the gate electrode GL1 (the second contact area CON2). The pixel electrode PTCO overlaps the common electrode CTCO1 via the insulating layer IL5. A storage capacitor is formed by the pixel electrode PTCO, the insulating layer IL5, and the connecting electrode ZTCO.

As shown in FIG. 2 and FIG. 15, the common auxiliary electrode CMTL is provided in a grid shape so as to surround the periphery of the pixel area. That is, the common auxiliary electrode CMTL is provided commonly for multiple pixels. In other words, the common auxiliary electrode CMTL has an opening OP. The opening OP is provided to expose the pixel electrode PTCO. A pattern of the opening OP is provided inside the pattern of the pixel electrode PTCO. An area provided with the opening OP corresponds to the display area of each pixel. That is, the opening ZCON (the first contact area CON1) is included in the display area. The display area of each pixel means an area in which a user can see light from a pixel. For example, an area that is shielded from light by a metal layer and is invisible to the user is not included in the display area. That is, the above display area of each pixel may be referred to as a "translucent area". An area of the common auxiliary electrode CMTL extending along the direction D1 overlaps the opening PCON. In this case, as shown in FIG. 3, the pixel electrode PTCO overlaps the common electrode CTCO1 via the insulating layer IL5. An area where the pixel electrode PTCO overlaps the common electrode CTCO1 via the insulating layer IL5 functions as a storage capacitor.

As shown in FIG. 2 and FIG. 16, the common electrode CTCO2 is provided commonly for multiple pixels. A slit SL is provided in an area corresponding to the above opening OP. The slit SL has a curved shape (longitudinally long S-shape). A tip of the slit SL has a shape in which a width orthogonal to an extending direction of the tip is reduced. Referring to FIG. 2 and FIG. 16, the common electrode CTCO2 has the slit SL at a position facing the pixel electrode PTCO (second transparent conductive layer). The common electrode CTCO2 overlaps the pixel electrode PCTO via the insulating layer IL6. An area where the common electrode CTCO2 overlaps the pixel electrode via the insulating layer IL6 functions as a storage capacitor (see FIG. 3).

[1-5. Materials of Each Member of Display Device 10]

A rigid substrate having light transmittance and no flexibility, such as a glass substrate, a quartz substrate, and a sapphire substrate can be used as the substrate SUB. On the other hand, in the case where the substrate SUB needs to have flexibility, a flexible substrate containing a resin and having flexibility, such as a polyimide substrate, an acrylic substrate, a siloxane substrate, or a fluororesin substrate can be used as the substrate SUB. In order to improve the heat resistance of the substrate SUB, impurities may be introduced into the above resin.

General metal materials can be used as the gate electrodes GL1, GL2, the wirings W1, W2, the light-shielding layer LS, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), and silver (Ag), or alloys or compounds thereof are used as members of these electrodes and the like. The above materials may be used in a single layer or a stacked layer as the members of the above electrodes and the like.

For example, a stacked structure of Ti/Al/Ti is used as the gate electrode GL1. In the present embodiment, the cross-sectional shape of a pattern end of the gate electrode GL1 having the above stacked structure is a forward taper shape.

General insulating materials can be used as the gate insulating layers GI1, GI2, and the insulating layers IL1 to IL6. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), and the like can be used as the insulating layers IL1 to IL3, IL5 and IL6. Low-defect insulating layers can be used as the insulating layers. Organic insulating materials such as a polyimide resin, an acrylic resin, an epoxy resin, a silicone resin, a fluororesin, or a siloxane resin can be used as the insulating layer IL4. The above organic insulating materials may be used as the gate insulating layers GI1, GI2, and the insulating layers IL1 to IL3, IL5, and IL6. The above insulating materials may be used in a single layer or a stacked layer as a member of the insulating layer and the like.

$SiO_x$ with a thickness of 100 nm is used as the gate insulating layer Gil as an example of the above insulating layer. $SiO_x/SiN_x/SiO_x$ with a total thickness of 600 nm to 700 nm is used as the insulating layer IL1. $SiO_x/SiN_x$ with a total thickness of 60 nm to 100 nm is used as the gate insulating layer GI2. $SiO_x/SiN_x/SiO_x$ with a total thickness of 300 nm to 500 nm is used as the insulating layer IL2. $SiO_x$ with a total thickness of 200 nm to 500 nm (single layer), $SiN_x$ (single layer), or a stack layer thereof is used as the insulating layer IL3. The organic layer with a thickness of 2 μm to 4 μm is used as the insulating layer IL4. $SiN_x$ (single layer) with a thickness of 50 nm to 150 nm is used as the insulating layer IL5.

The above $SiO_xN_y$ and $AlO_xN_y$ are silicon compounds and aluminum compounds containing nitrogen (N) in a smaller ratio (x>y) than oxygen (O). The above $SiN_xO_y$ and $AlN_xO_y$ are silicon compounds and aluminum compounds containing oxygen in a smaller ratio (x>y) than nitrogen.

A metal oxide having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used as the oxide semiconductor layer OS. In particular, an oxide semiconductor having a composition ratio of In:Ga:Zn:O=1:1:1:4 can be used. However, the oxide semiconductor containing In, Ga, Zn, and O used in the present embodiment is not limited to the above composition, and an oxide semiconductor having a composition different from that described above can also be used. For example, the ratio of In may be larger than that described above to improve mobility. The ratio of Ga may be larger to increase the band gap and reduce the influence of light irradiation.

Other elements may be added to the oxide semiconductor containing In, Ga, Zn, and O. For example, a metal element such as Al or Sn may be added to the oxide semiconductor. In addition to oxide semiconductor described above, an oxide semiconductor containing In and Ga (IGO), an oxide semiconductor containing In and Zn (IZO), an oxide semiconductor containing In, Sn, and Zn (ITZO), and an oxide semiconductor containing In and W may be used as the oxide semiconductor layer OS. The oxide semiconductor layer OS may be amorphous or crystalline. The oxide semiconductor layer OS may be a mixed phase of amorphous and crystalline.

A transparent conductive layer is used as the connecting electrode ZTCO, the common electrode CTCO1, the pixel electrode PTCO, and the common electrode CTCO2. A mixture of indium oxide and tin oxide (ITO) and a mixture of indium oxide and zinc oxide (IZO) can be used as the transparent conductive layer. Materials other than the above may be used as the transparent conductive layer.

As described above, according to the display device 10 according to the present embodiment, conduction between the oxide semiconductor layer OS and the connecting electrode ZTCO can be ensured by directly contacting the oxide semiconductor layer OS and the connecting electrode ZTCO in the transistor Tr1. Therefore, there is no need to provide a metal layer between the oxide semiconductor layer OS and the connecting electrode ZTCO. With this configuration, since light is not blocked in the opening ZCON (the first contact area CON1), it is possible to suppress a decrease in the opening ratio. Since the layer exposed to the display area is the oxide semiconductor layer OS having light transmittance in which unevenness in transmitted light hardly occurs as in a silicon layer, it is possible to suppress the occurrence of display unevenness.

As the display device pixel is scaled down, the pixel electrode is more susceptible to capacitive coupling due to the signal line. If an attempt is made to drive a scaled down pixel at a high speed, the effect of crosstalk in which the potential of the pixel electrode changes due to the potential of the signal line may become apparent.

In the display device 10 according to an embodiment of the present invention, the common electrode CTCO1 is provided to intersect the wiring W1-1 and the wiring W1-2 extending in the direction D2. The common electrode CTCO1 is provided along the direction D1 so as to cross a plurality of pixels. Therefore, the wirings W1-1, 1-2 and the pixel electrode PTCO can be shielded by the common electrode CTCO1. Therefore, it is possible to reduce the capacitive coupling between the wirings W1-1, W1-2 and the pixel electrode. In the display area of the pixel, the storage capacitor by the pixel electrode PTCO, the insulating layer IL5, and the common electrode CTCO1 can be added to the storage capacitor by the pixel electrode PTCO and the insulating layer IL6. As a result, storage capacity can be increased, so that the effect of the potential due to the capacitive coupling can be reduced. As described above, in the display device 10, since the effect of the potential due to capacitive coupling can be reduced in the scaled down pixel, it is possible to reduce crosstalk.

2. Second Embodiment

Figure 17:
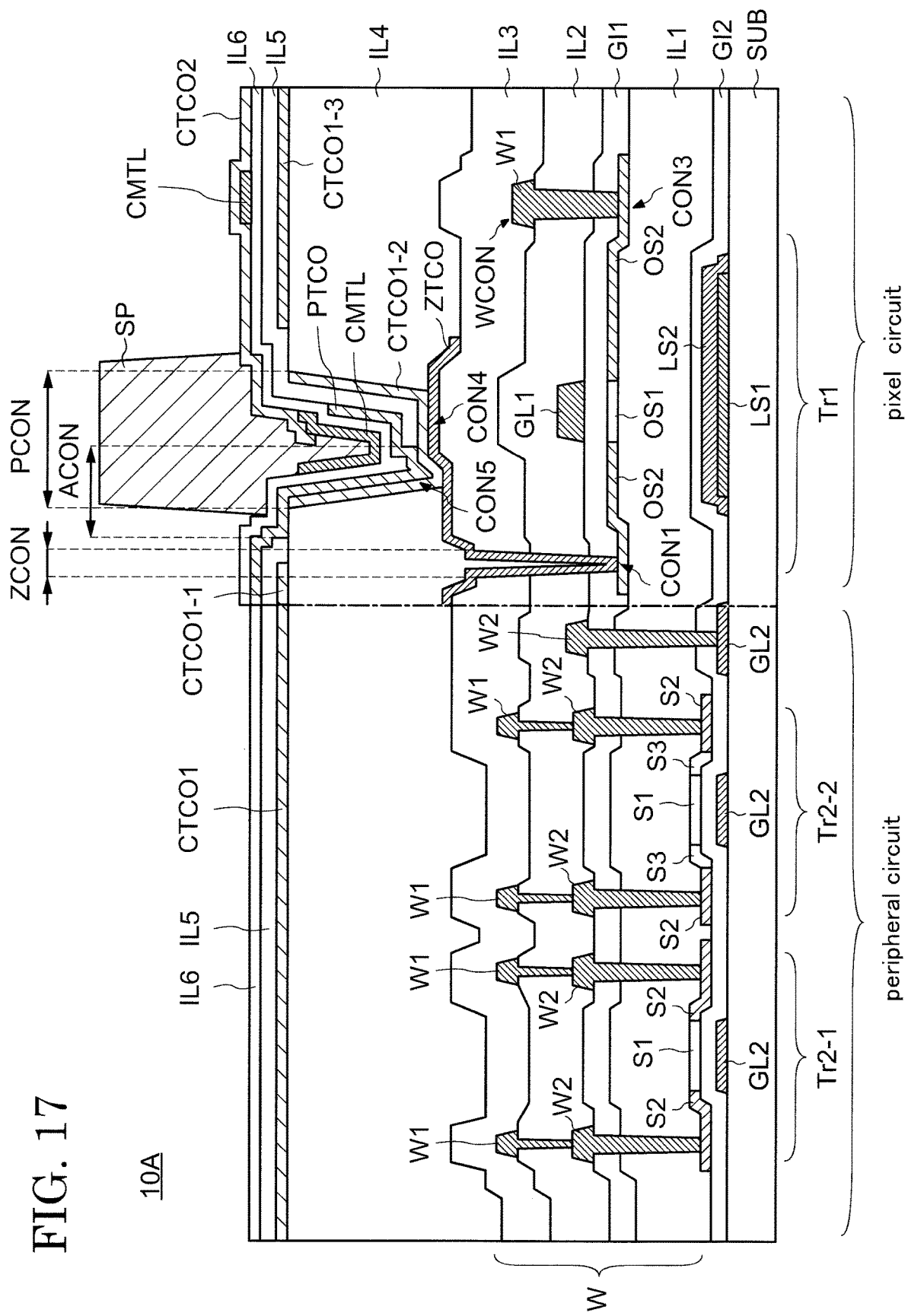
FIG. 17 is a cross-sectional view showing an outline of a display device according to an embodiment of the present invention.
Figure 18:
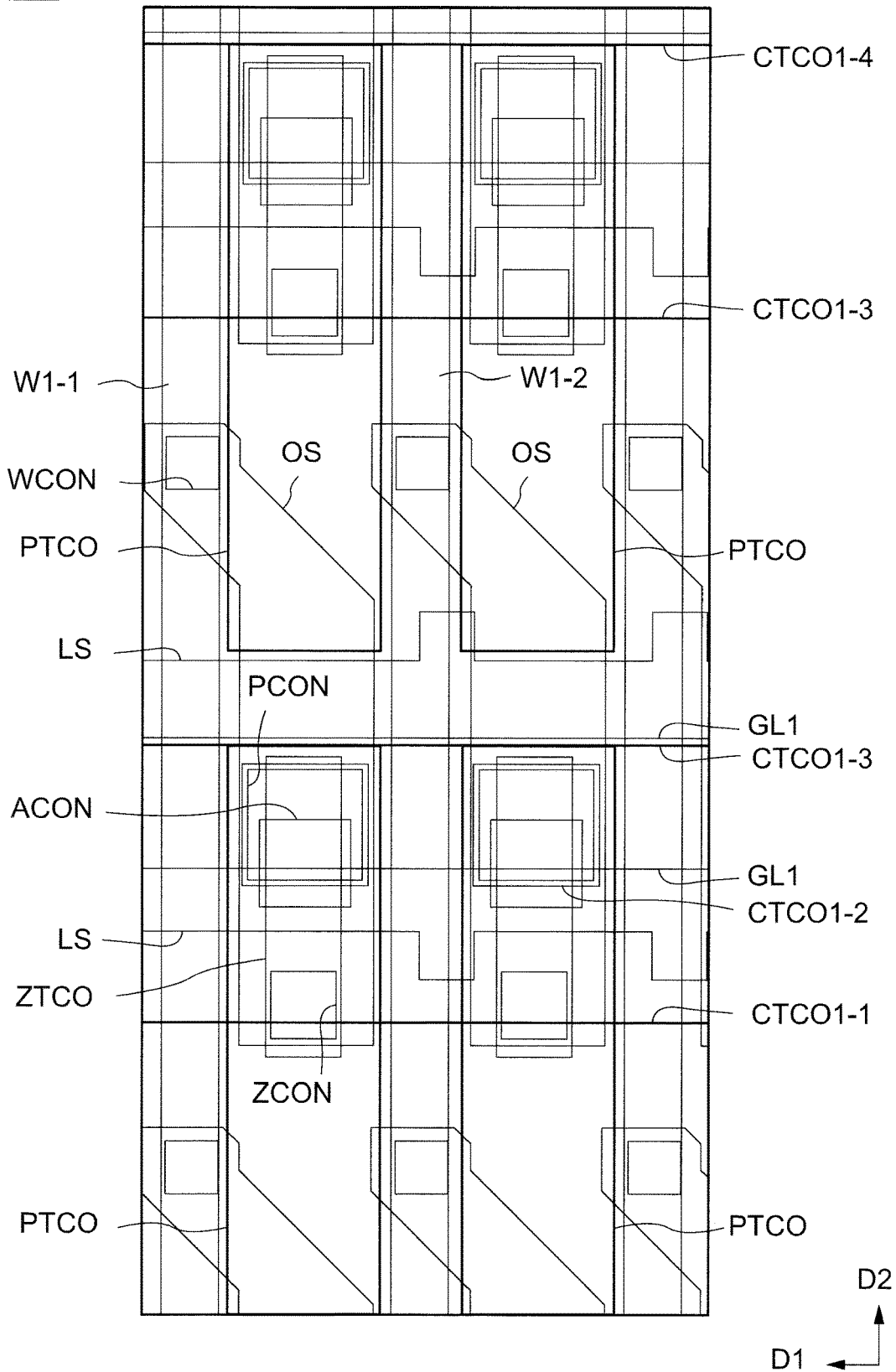
FIG. 18 is a plan view showing an outline of a display device according to an embodiment of the present invention.
Figure 19:
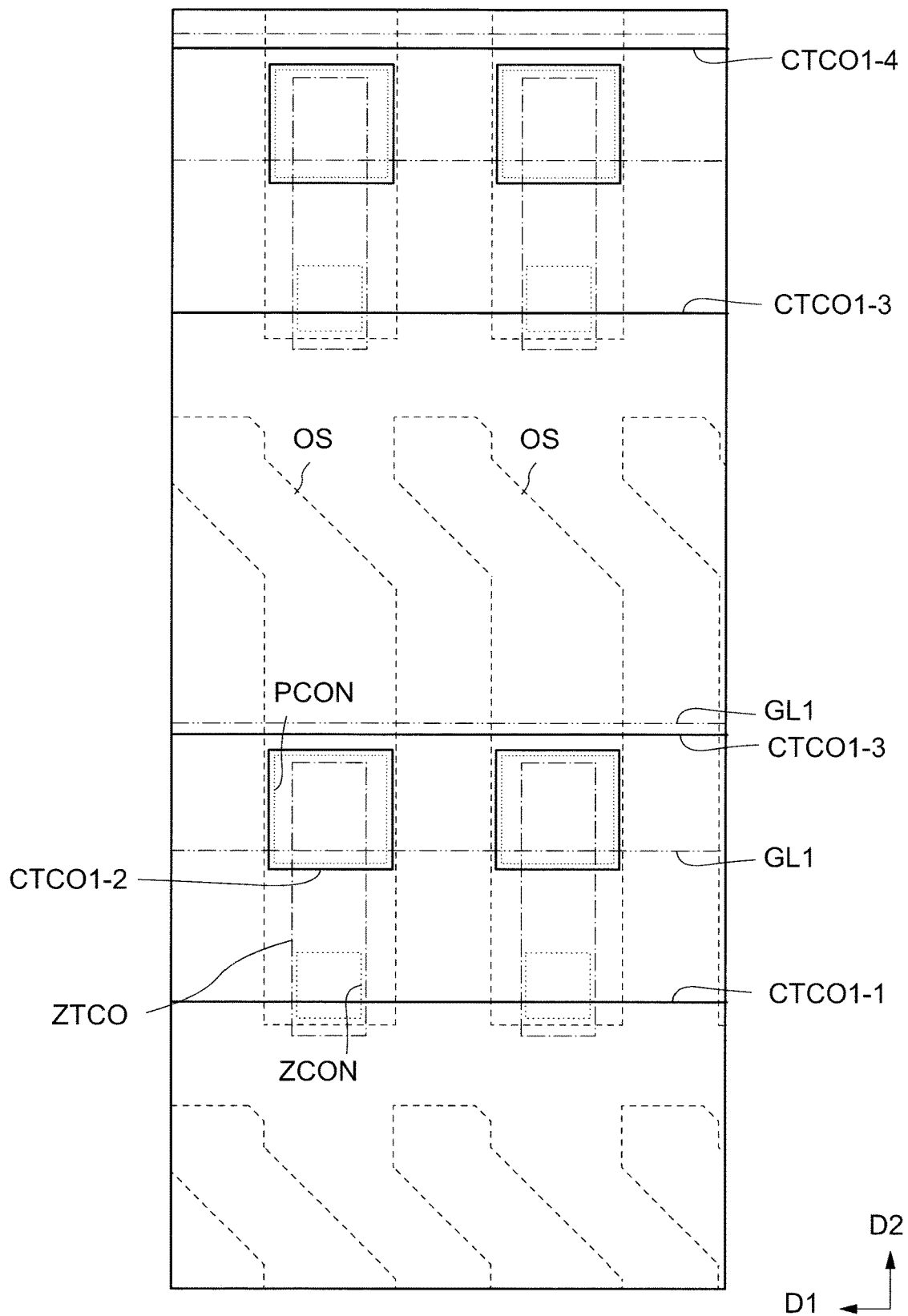
FIG. 19 is a plan view showing an outline of a display device according to an embodiment of the present invention.

A configuration of a display device 10A according to an embodiment of the present invention will be described with reference to FIG. 17 to FIG. 19. FIG. 17 is a cross-sectional view showing the display device 10A according to an embodiment of the present invention. FIG. 18 is a plane layout of a pixel of the display device 10A. In FIG. 18, the common auxiliary electrode CMTL, the common electrode CTCO2, and the spacer SP are omitted. FIG. 19 shows a plane layout of common electrodes CTCO1-1 to CTCO1-4. Although the display device 10A shown in FIG. 17 to FIG. 19 is similar to the display device 10 shown in FIG. 1, the configuration of the electrode in the opening PCON is different. Elements having the same configuration as that of the display device 10 are denoted by the same symbols, and descriptions thereof are omitted.

As shown in FIG. 17, an island-shaped common electrode CTCO1-2 (also referred to as a fifth transparent conductive layer) may be provided inside the opening PCON. The common electrode CTCO1-2 is provided between the connecting electrode ZTCO and the pixel electrode PCTO. The common electrode CTCO1-2 is formed from the same transparent conductive film as the common electrode CTCO1-1. The common electrode CTCO1-2 is provided in contact with the insulating layer IL4 in the opening PCON. The common electrode CTCO1-2 is connected to the connecting electrode ZTCO via the opening PCON. An area where the common electrode CTCO1-2 and the connecting electrode ZTCO are in contact with each other is referred to as a fourth contact area CON4. The fourth contact area CON4 is provided in the opening PCON. The fourth contact area CON4 is provided in an area overlapping the gate electrode GL1. As shown in FIG. 18 and FIG. 19, the common electrodes CTCO1-1, CTCO1-3, and CTCO1-4 are provided so as to overlap the wiring W1-1, the wiring W1-2 along the direction D1. The common electrode CTCO1-2 is provided apart from the common electrode CTCO1-1. The common electrodes CTCO1-1, CTCO1-3, and CTCO1-4 are supplied with a predetermined reference potential together with the common electrode CTCO2, while the common electrode CTCO1-2 is provided apart from the other common electrode and does not become the reference potential. In view of this, the common electrode CTCO1-2 may be referred to as an island-shaped electrode. Since the common electrode CTCO1-2 is connected to the connecting electrode ZTCO and the pixel electrode PCTO as described above, it has a predetermined pixel potential.

The insulating layer IL5 is provided on the common electrodes CTCO1-1 and CTCO1-2. The pixel electrode PTCO is provided on the insulating layer IL5. The pixel electrode PTCO is connected to the common electrode CTCO1-2 via the opening ACON provided in the insulating layer IL5. The pixel electrode PTCO faces the common electrode CTCO1-1 with the insulating layer IL4 interposed therebetween. That is, in the opening ACON, an area where the pixel electrode PTCO and the common electrode CTCO1-2 are in contact with each other is referred to as a fifth contact area CON5. The fifth contact area CON5 is provided in the opening ACON. As described above, the pixel electrode PTCO may be provided above the common electrode CTCO2. A part of the opening ACON is provided so as to overlap the opening PCON. That is, the fifth contact area CON5 at least partially overlaps the fourth contact area CON4. The fifth contact area CON5 is provided above the gate electrode GL1. The common electrode CTCO1-2 overlaps the gate electrode GL1. By providing the fifth contact area CON5 and the common electrode CTCO1-2 above the gate electrode GL1, the light is not blocked in the opening ACON so that it is possible to suppress a decrease in the opening ratio.

The insulating layer IL6 is provided on the pixel electrode PTCO. The common electrode CTCO1-1 faces the common electrode CTCO2 via the insulating layer IL6. The opening OP of the common electrode CTCO2 overlaps the opening ACON and the opening PCON.

According to the display device 10A of the present embodiment, the same effects as those of the display device 10 of the first embodiment can be obtained. In the display device 10A, the common electrode CTCO1-2 is provided inside the opening PCON provided in the insulating layer IL4. The common electrode CTCO1-2 provided inside the opening PCON serves to block hydrogen entering from the outside. As a result, it is possible to suppress the penetration of hydrogen into the oxide semiconductor layer OS. Therefore, it is possible to suppress fluctuations in the characteristic of the transistor Tr1 due to hydrogen intrusion into the oxide semiconductor layer OS.

3. Third Embodiment

Figure 20:
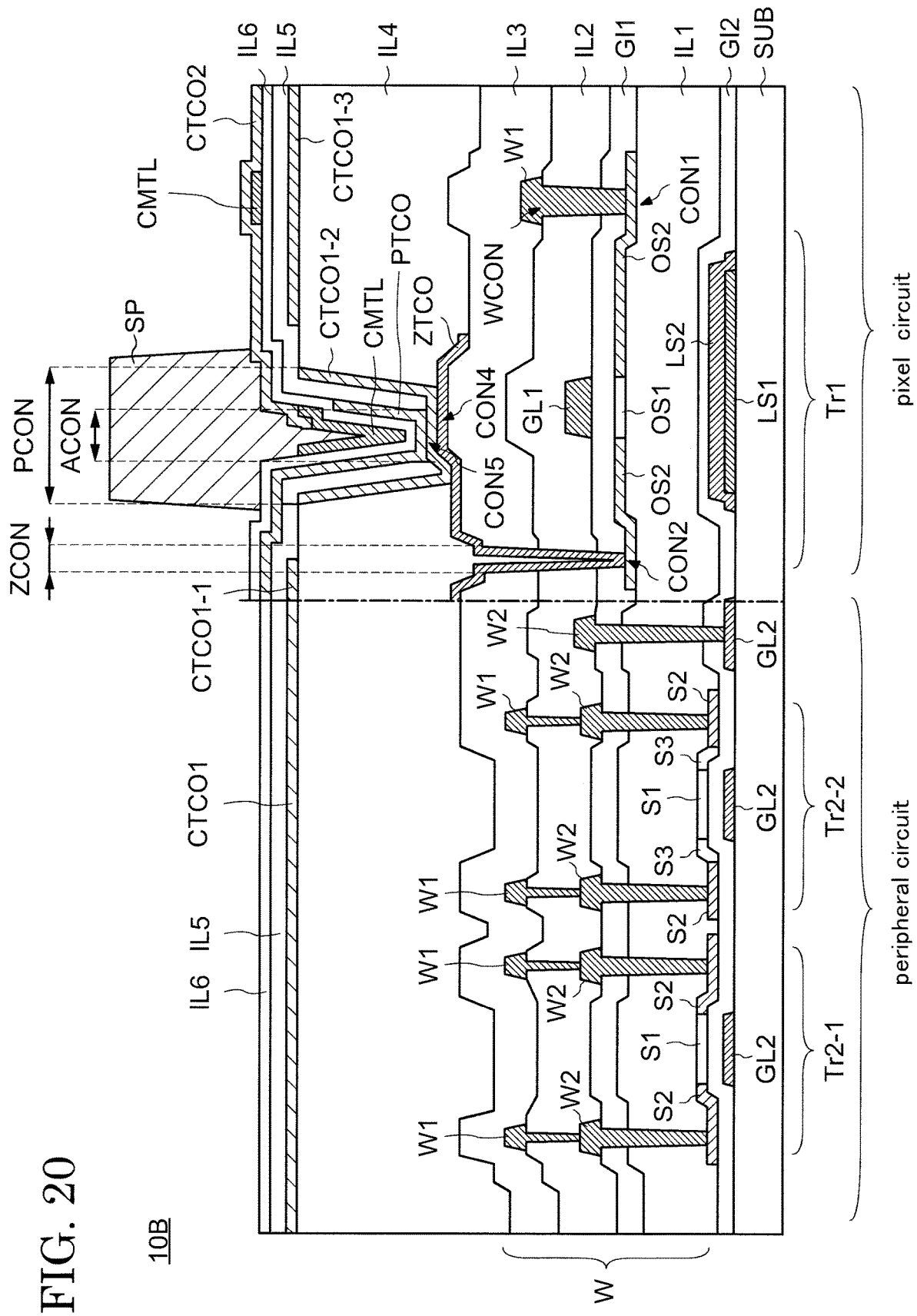
FIG. 20 is a cross-sectional view showing an outline of a display device according to an embodiment of the present invention.
Figure 21:
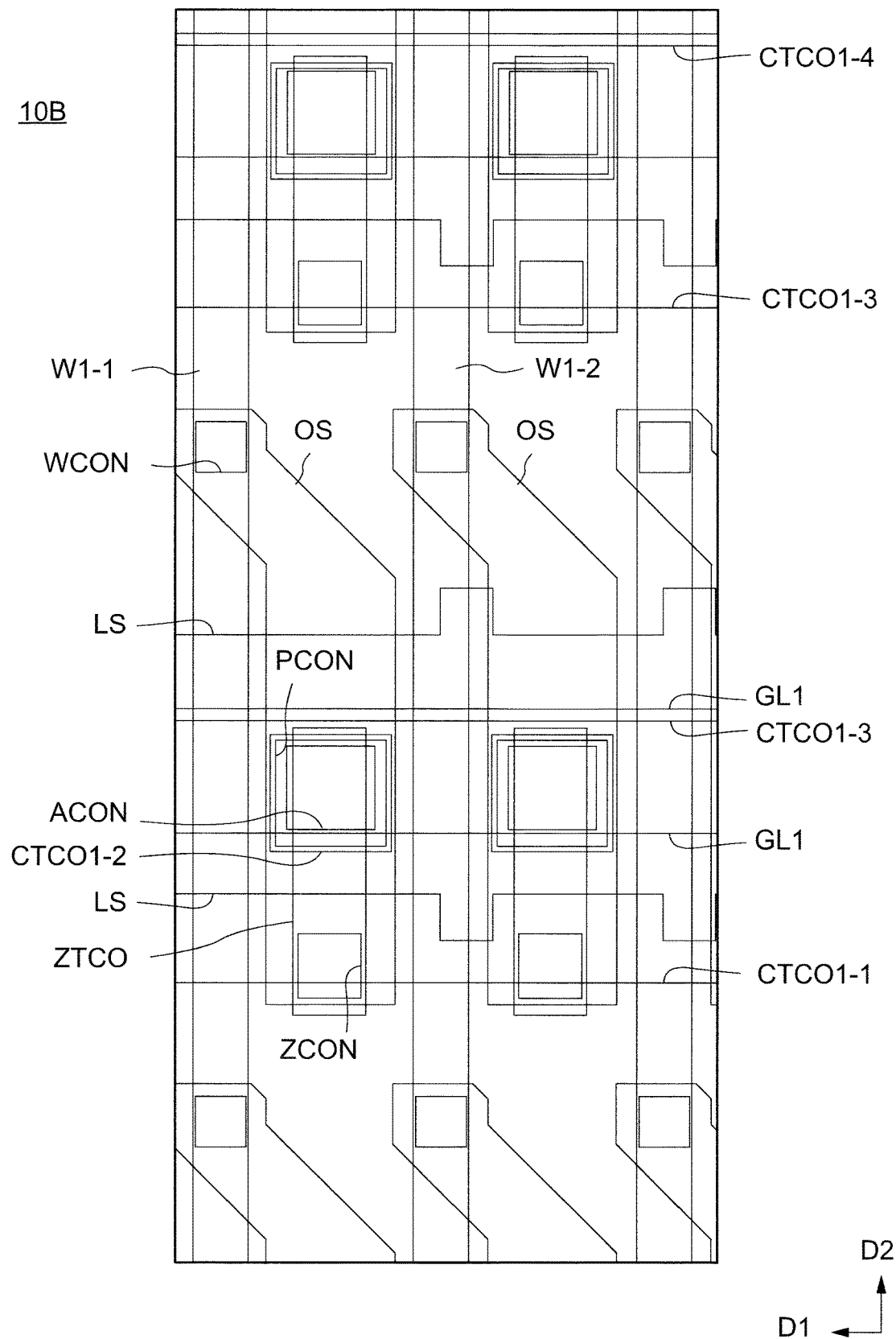
FIG. 21 is a plan view showing an outline of a display device according to an embodiment of the present invention.

A configuration of a display device 10B according to an embodiment of the present invention will be described with reference to FIG. 20 to FIG. 21. FIG. 20 is a cross-sectional view showing a display device according to an embodiment of the present invention. FIG. 21 is a plane layout of a pixel of the display device 10B. In FIG. 21, the common auxiliary electrode CMTL, the common electrode CTCO2, and the spacer SP are omitted. Although the display device 10B shown in FIG. 20 to FIG. 21 is similar to the display device 10 shown in FIG. 17, the configuration of the electrode in the opening PCON is different. Elements having the same configuration as that of the display device 10 are denoted by the same symbols, and descriptions thereof are omitted.

As shown in FIG. 20 to FIG. 21, the common electrode CTCO1-2 is provided inside the opening PCON. The insulating layer IL5 is provided on the common electrodes CTCO1-1 and CTCO1-2. The insulating layer IL5 has the opening ACON. The pixel electrode PTCO is connected to the common electrode CTCO1-2 via the opening ACON. The opening ACON is provided so that it overlaps inside the opening PCON. Therefore, the fourth contact area CON4 overlapping the connecting electrode ZTCO and the common electrode CTCO1-2 overlaps the fifth contact area CON5 overlapping the common electrode CTCO1-2 and the pixel electrode PCTO. Compared to the display device 10, both of the fourth contact area CON4 and the fifth contact area CON5 can be arranged further apart from the common electrode CTCO1-1 in the display area. This makes it possible to increase the area of the common electrodes CTCO1-1, CTCO1-3, and CTCO1-4 extending in the direction D1. By increasing the area of the common electrodes CTCO1-1, CTCO1-3, and CTCO1-4, the shielding properties of the common electrodes CTCO1-1, CTCO1-3, and CTCO1-4 can be further enhanced.

According to the display device 10B of the present embodiment, the same effects as those of the display device 10 of the first embodiment can be obtained.

4. Fourth Embodiment

Figure 22:
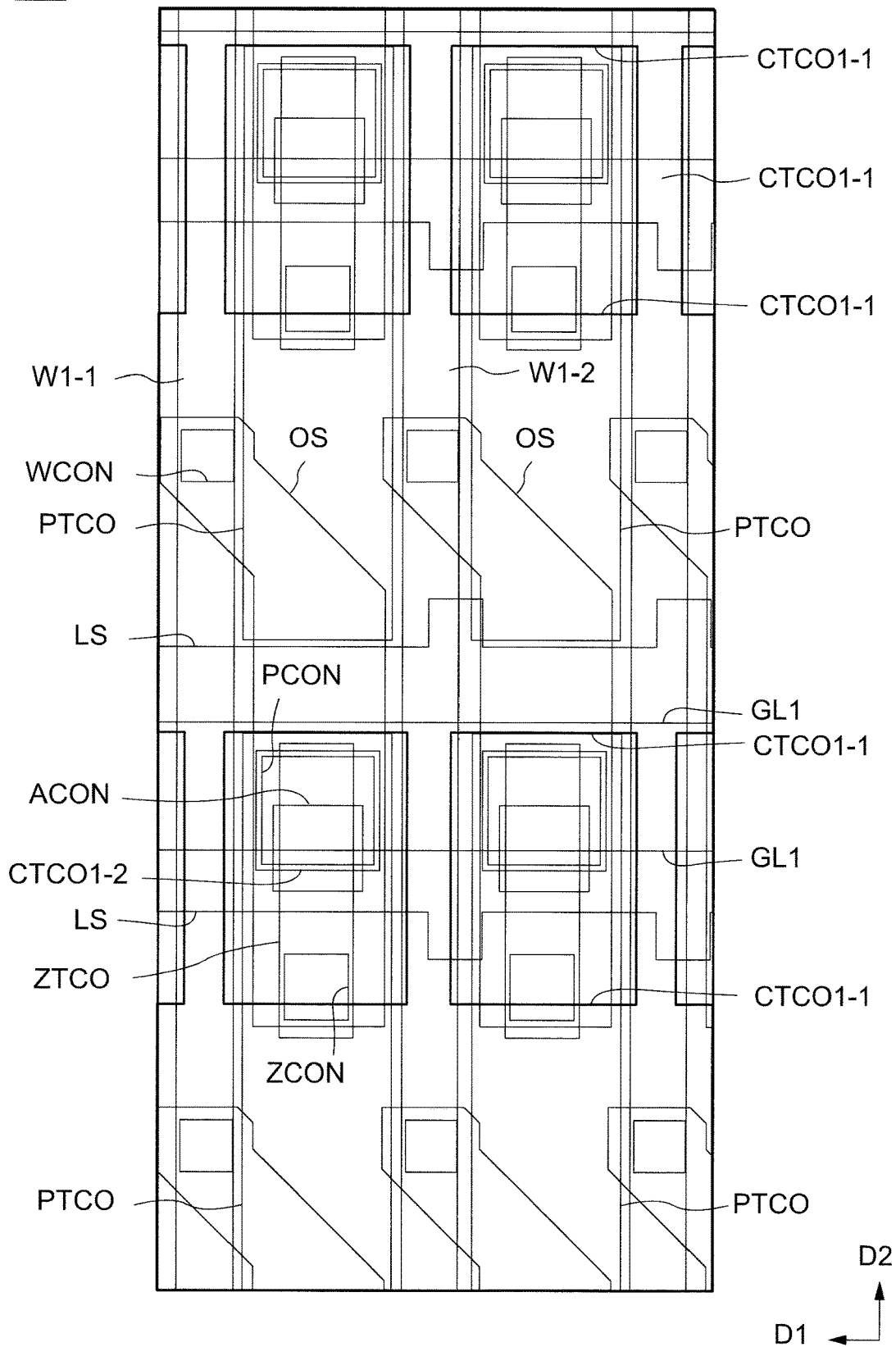
FIG. 22 is a plan view showing an outline of a display device according to an embodiment of the present invention.

A configuration of a display device 10C according to an embodiment of the present invention will be described with reference to FIG. 22. FIG. 22 is a plane layout of a pixel of the display device 10C. In FIG. 22, the common auxiliary electrode CMTL, the common electrode CTCO2, and the spacer SP are omitted. Although the display device 10C shown in FIG. 22 is similar to the display device 10B shown in FIG. 17, the shape of the common electrode CTCO1-1 is different. In FIG. 17, the common electrode CTCO2 and elements having the same configuration as that of the display device 10 are denoted by the same symbols, and descriptions thereof are omitted.

As shown in FIG. 22, the common electrode CTCO1 has a first area extending in the direction D1 and a second area extending in the direction D2. The first area is an area overlapping the wiring W1 and the wiring W2 and extending in the direction D1. The second area is an area extending along the wiring W1 and the wiring W2. The second area is provided so as to overlap the wiring W1, W2. Although a width in the direction D1 in the second area is provided to be smaller than a width of the wiring W1, W2, it may be provided to be larger than the width of the wiring W1, W2.

According to the display device 10C of the present embodiment, the same effects as those of the display device 10 of the first embodiment can be obtained. Further, by providing the second area in the common electrode CTCO1, the resistance of the entire common electrode CTCO1 can be reduced.

By providing the second area in the common electrode CTCO1, the influence received by the pixel electrode PTCO from the wiring W1 and the wiring W2 can be reduced.

5. Fifth Embodiment

Figure 23:
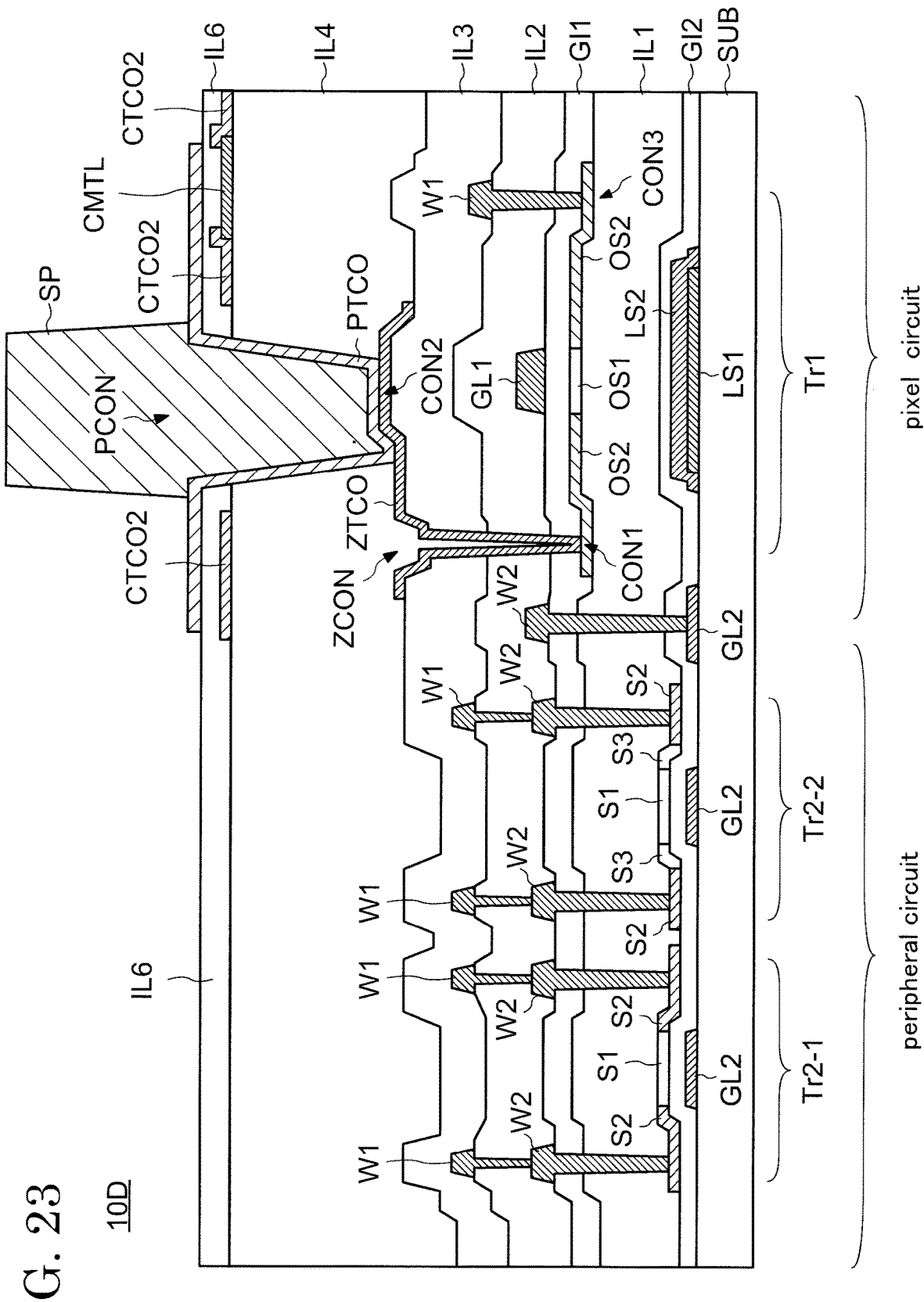
FIG. 23 is a cross-sectional view showing an outline of a display device according to an embodiment of the present invention.

A configuration of a display device 10D according to an embodiment of the present invention will be described with reference to FIG. 23. FIG. 23 is a cross-sectional view showing an outline of a display device according to an embodiment of the present invention. Although the display device 10D shown in FIG. 23 is similar to the display device 10 shown in FIG. 1, the positional relationship between the pixel electrode PTCO and the common electrode CTCO2 is different.

As shown in FIG. 23, the insulating layer IL6 is provided on the common auxiliary electrode CMTL and the common electrode CTCO2. The pixel electrode PTCO is provided on the insulating layer IL6. The pixel electrode PTCO is connected to the connecting electrode ZTCO via the opening PCON provided in the insulating layers IL4 and IL6. The pixel electrode PTCO may be provided above the common electrode CTCO2 as described above.

According to the display device and 10D of the present embodiment, the same effects as those of the display device 10 of the first embodiment can be obtained.

6. Sixth Embodiment

A description of the entire configuration of the display device described in the first to fifth embodiments will be described with reference to FIG. 24 to FIG. 26.

[6-1. Outline of Display Device 20B]

Figure 24:
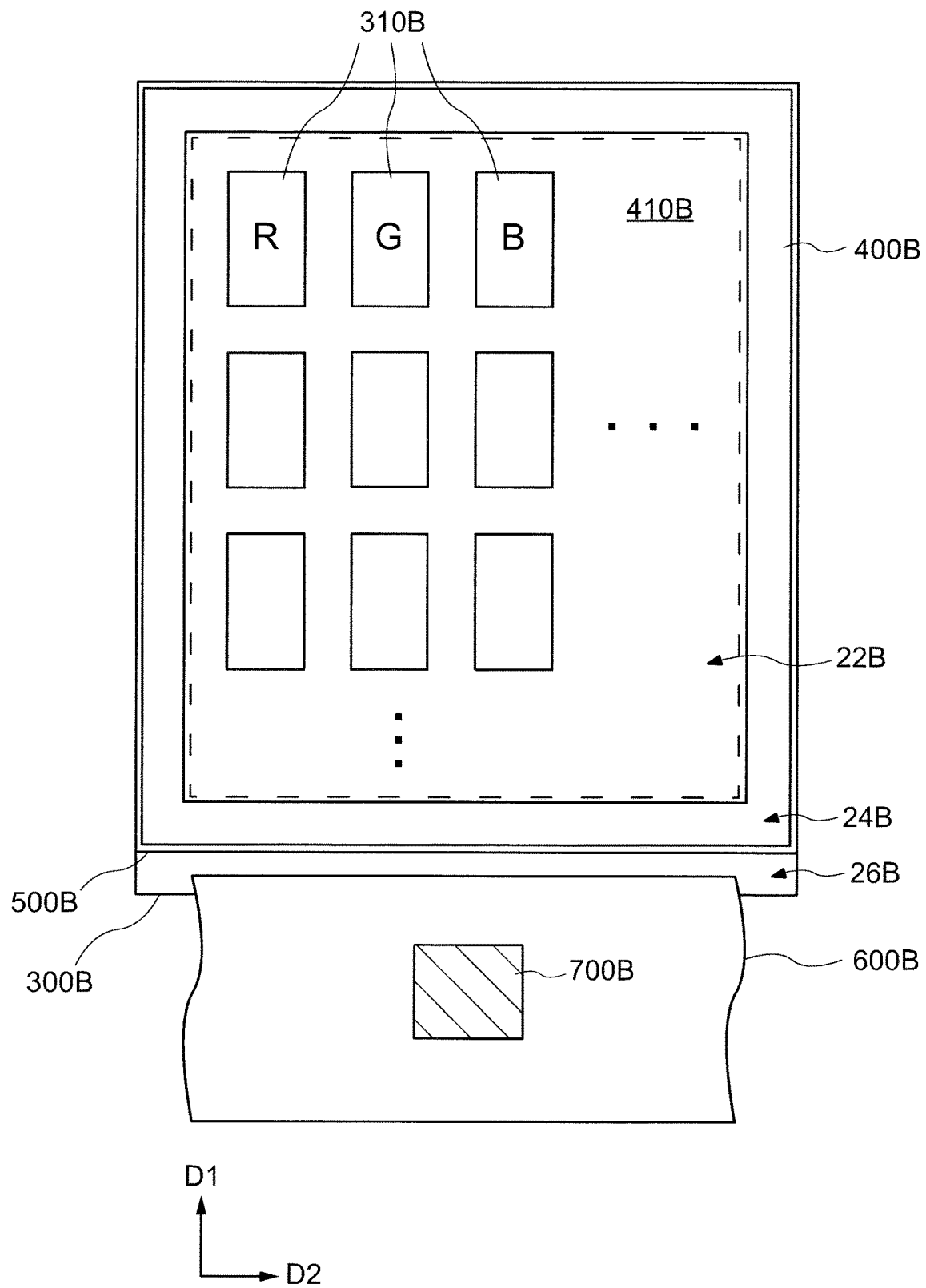
FIG. 24 is a plan view showing an outline of a display device according to an embodiment of the present invention.

FIG. 24 is a plan view showing an outline of a display device according to an embodiment of the present invention. As shown in FIG. 24, the display device 20B includes an array substrate 300B, a seal part 400B, a counter substrate 500B, a flexible printed circuit board 600B (FPC 600B), and an IC chip 700B. The array substrate 300B and the counter substrate 500B are bonded by the seal 400B. A plurality of pixel circuits 310B is arranged in a matrix in a liquid crystal area 22B surrounded by the seal part 400B. The liquid crystal area 22B is an area that overlaps a liquid crystal element 410B to be described later in a plan view. The liquid crystal area 22B is an area that contributes to a display operation. The liquid crystal area 22B may be referred to as a "display area". The transistor Tr1 described above is provided in the liquid crystal area 22B (the display area).

A seal area 24B provided with the seal part 400B is an area around the liquid crystal area 22B. The FPC 600B is provided in a terminal area 26B. The terminal area 26B is an area where the array substrate 300B is exposed from the counter substrate 500B and is provided on the outside the seal area 24B. The outside of the seal area means an area provided with the seal part 400B and the outside of the area surrounded by the seal part 400B. The IC chip 700B is provided on the FPC 600B. The IC chip 700B supplies a signal for driving each pixel circuit 310B. The seal area 24B or the area where the seal area 24B and the terminal area 26B are combined is an area that surrounds the liquid crystal area 22B (the display area). These areas are sometimes referred to as a "frame area". The transistor Tr2 is provided in the frame area.

[6-2. Circuit Configuration of Display Device 20B]

Figure 25:
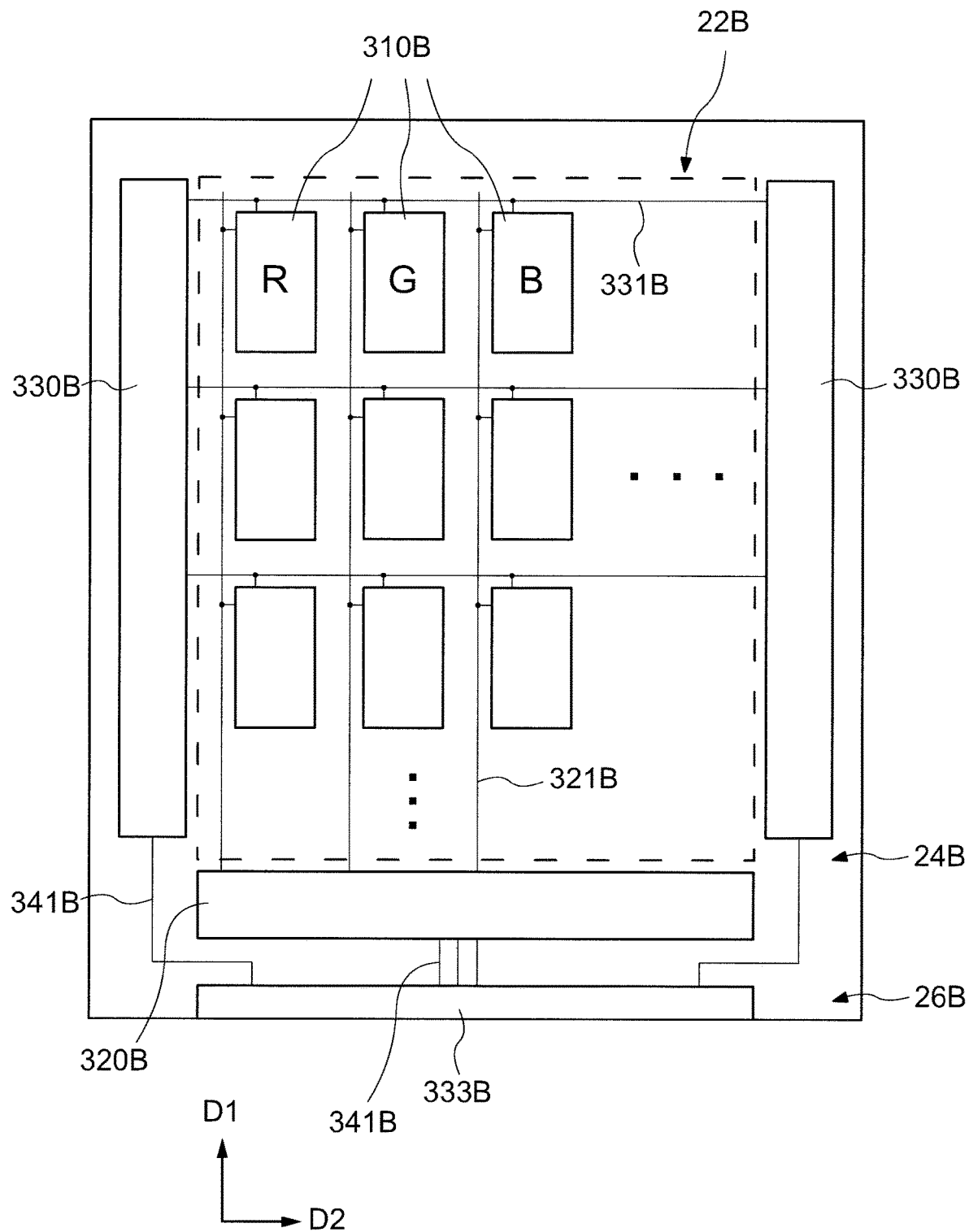
FIG. 25 is a block diagram showing a circuit configuration of a display device according to an embodiment of the present invention.

FIG. 25 is a block diagram showing a circuit configuration of a display device according to an embodiment of the present invention. As shown in FIG. 25, a source driver circuit 320B is provided at a position adjacent to the liquid crystal area 22B in which the pixel circuit 310B is arranged in the direction D1 (column direction), and a gate driver circuit 330B is provided at a position adjacent to the liquid crystal area 22B in the direction D2 (row direction). The source driver circuit 320B and the gate driver circuit 330B are provided in the seal area 24B described above. However, the area where the source driver circuit 320B and the gate driver circuit 330B are provided is not limited to the seal area 24B and may be any area as long as it is outside of the area where the pixel circuit 310B is provided.

A source wiring 321B extends from the source driver circuit 320B in the direction D1 and is connected to the plurality of pixel circuits 310B arranged in the direction D1. A gate wiring 331B extends from the gate driver circuit 330B in the direction D2 and is connected to the plurality of pixel circuits 310B arranged in the direction D2.

A terminal part 333B is provided in the terminal area 26B. The terminal part 333B and the source driver 320B are connected by a connected wiring 341B. Similarly, the terminal part 333B and the gate driver circuit 330B are connected by the connecting wiring 341B. When the FPC 600B is connected to the terminal part 333B, an external device to which the FPC 600B is connected and the display device 20B are connected, and each pixel circuit 310B provided in the display device 20B is driven by a signal from the external device.

The transistor Tr1 shown in the first embodiment and the second embodiment is used in the pixel circuit 310B. The transistor Tr2 shown in the first embodiment and the second embodiment is applied to the transistor included in the source driver circuit 320B and the gate driver circuit 330B.

[Pixel Circuit 310B in Display Device 20B]

Figure 26:
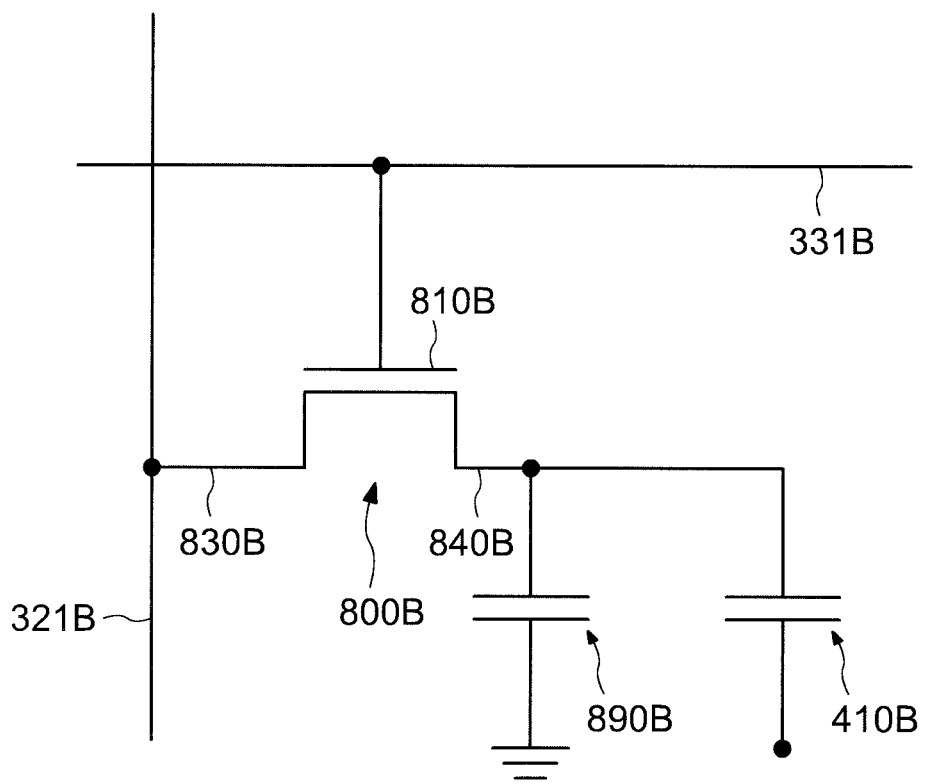
FIG. 26 is a circuit diagram showing a pixel circuit of a display device according to an embodiment of the present invention.

FIG. 26 is a circuit diagram showing a pixel circuit of a display device according to an embodiment of the present invention. As shown in FIG. 26, the pixel circuit 310B includes elements such as a transistor 800B, a storage capacitor 890B, and a liquid crystal element 410B. The transistor 800B has a first gate electrode 810B, a first source electrode 830B, and a first drain electrode 840B. The first gate electrode 810B is connected to the gate wiring 331B. The first source electrode 830B is connected to the source wiring 321B. The first drain electrode 840B is connected to the storage capacitor 890B and the liquid crystal element 410B. The transistor Tr1 shown in the first embodiment and the second embodiment is applied to the transistor 800B shown in FIG. 26. The storage capacitor 890B includes a storage capacitor formed by the pixel electrode and the common electrode CTCO1 and a storage capacitor formed by the pixel electrode and the common electrode CTCO2. Although the same reference potential is supplied to the common electrode CTCO1 and the common electrode CTCO2 to form the storage capacitor, the reference potential may be a predetermined fixed potential or may be a pulse wave (AC rectangular wave) with a certain period.

In the present embodiment, for convenience of explanation, although 830B is referred to as a source electrode and 840B is referred to as a drain electrode, the function as a source and the function as a drain may be replaced in each electrode.

Each of the embodiments described above as an embodiment of the present invention can be appropriately combined and implemented as long as they do not contradict each other. Further, the addition, deletion, or design change of components as appropriate by those skilled in the art based on each embodiment are also included in the scope of the present invention as long as they are provided with the gist of the present invention.

It is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
   a pixel including a transistor, a pixel electrode, and a common electrode;
   a semiconductor layer included in the transistor;
   a gate electrode overlapping the semiconductor layer;
   a signal line electrically connected to the semiconductor layer;
   a first conductive layer electrically connecting the semiconductor layer and the pixel electrode;
   a first insulating layer formed on the first conductive layer and having a contact hole exposing the first conductive layer;
   a second conductive layer between the first insulating layer and the pixel electrode; and
   a second electrode in the contact hole,
   wherein the contact hole overlaps the gate electrode,
   the first conductive layer has a contact area which faces the pixel electrode in the contact hole,
   the second conductive layer is located between the signal line and the pixel electrode, and
   the second electrode is formed of a metal, and in physical contact with the common electrode in the contact hole.

2. The display device according to claim 1, wherein the semiconductor layer is formed of an oxide semiconductor.

3. The display device according to claim 1, wherein the second conductive layer is electrically connected to the common electrode.

4. The display device according to claim 1, wherein the contact area is in physical contact with the pixel electrode.

5. The display device according to claim 1, wherein the contact area is in contact with the pixel electrode via a first electrode located on the first conductive layer and the first insulating layer.

6. The display device according to claim 5, wherein the first electrode and the second conductive layer are in a same layer.

7. The display device according to claim 1, further comprising a spacer overlapping the contact area,
   wherein the contact hole is filled with the spacer, and
   the spacer protrudes toward an opposite side of the transistor from the contact hole.

8. The display device according to claim 7, wherein a part of the common electrode is located between the spacer and the pixel electrode.

9. The display device according to claim 1, wherein the first conductive layer is in physical contact with the semiconductor layer at a first portion, and
   the contact hole does not overlap the first portion.

10. The display device according to claim 1, wherein the signal line is in physical contact with the semiconductor layer at a second portion, and
    the contact hole does not overlap the second portion.

11. The display device according to claim 1, further comprising pixels including the pixel,
    wherein the second electrode has a grid shape, and overlaps the pixels.

12. The display device according to claim 1, wherein the second conductive layer is located between the pixel electrode and the signal line in a plan view.

13. The display device according to claim 1, further comprising a light-shielding layer overlapping the gate electrode,
    wherein the semiconductor layer is located between the light-shielding layer and the gate electrode,
    the first conductive layer is in physical contact with the semiconductor layer at a first portion, and
    the light-shielding layer does not overlap the first portion.

14. The display device according to claim 13, wherein the signal line is in physical contact with the semiconductor layer at a second portion, and
    the light-shielding layer does not overlap the second portion.

15. The display device according to claim 13, wherein the light-shielding layer overlaps a whole of the contact hole.

16. The display device according to claim 1, wherein the second conductive layer has a grid shape.

17. A display device comprising:
    a pixel including a transistor, a pixel electrode, and a common electrode;
    a semiconductor layer included in the transistor;
    a gate electrode overlapping the semiconductor layer;
    a signal line electrically connected to the semiconductor layer;
    a first conductive layer electrically connecting the semiconductor layer and the pixel electrode;
    a first insulating layer formed on the first conductive layer and having a contact hole exposing the first conductive layer;
    a second conductive layer between the first insulating layer and the pixel electrode; and
    a spacer filling the contact hole,
    wherein the contact hole overlaps the gate electrode,
    the first conductive layer has a contact area which faces the pixel electrode in the contact hole,
    the second conductive layer overlaps the pixel electrode and a common electrode,
    the spacer overlaps the contact area and protrudes toward an opposite side of the transistor from the contact hole, and
    a part of the common electrode is located between the spacer and the pixel electrode.

18. The display device according to claim 17, wherein the first conductive layer is in physical contact with the semiconductor layer at a first portion,
    the signal line is in physical contact with the semiconductor layer at a second portion, and
    the spacer overlaps neither the first portion nor the second portion.

19. A display device comprising:
    a pixel including a transistor, a pixel electrode, and a common electrode;
    a semiconductor layer included in the transistor;
    a gate electrode overlapping the semiconductor layer;
    a signal line electrically connected to the semiconductor layer;
    a first conductive layer electrically connecting the semiconductor layer and the pixel electrode;
    a first insulating layer formed on the first conductive layer and having a contact hole exposing the first conductive layer;
    a second conductive layer between the first insulating layer and the pixel electrode; and
    a spacer overlapping the contact area, wherein the contact hole overlaps the gate electrode,
the first conductive layer has a contact area which faces the pixel electrode in the contact hole,
the second conductive layer is located between the signal line and the pixel electrode,
the contact hole is filled with the spacer,
the spacer protrudes toward an opposite side of the transistor from the contact hole, and
a part of the common electrode is located between the spacer and the pixel electrode.

* * * * *